US012235698B2

(12) United States Patent
Jeon et al.

(10) Patent No.: US 12,235,698 B2
(45) Date of Patent: Feb. 25, 2025

(54) SEMICONDUCTOR DEVICE AND POWER OFF METHOD OF A SEMICONDUCTOR DEVICE

(71) Applicant: SAMSUNG ELECTRONICS CO., LTD., Suwon-si (KR)

(72) Inventors: Ho-Yeon Jeon, Hwaseong-si (KR); Dae Hwan Kim, Hwaseong-si (KR); Young Hoon Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 12 days.

(21) Appl. No.: 18/205,014

(22) Filed: Jun. 2, 2023

(65) Prior Publication Data

US 2023/0315179 A1    Oct. 5, 2023

Related U.S. Application Data

(63) Continuation of application No. 17/857,526, filed on Jul. 5, 2022, now Pat. No. 11,709,537, which is a (Continued)

(30) Foreign Application Priority Data

Aug. 28, 2017  (KR) .................. 10-2017-0108758

(51) Int. Cl.
*G06F 1/00*    (2006.01)
*G06F 1/26*    (2006.01)
(Continued)

(52) U.S. Cl.
CPC .................. *G06F 1/28* (2013.01); *G06F 1/26* (2013.01); *G11C 5/148* (2013.01); *G06F 1/30* (2013.01); *G06F 1/3203* (2013.01)

(58) Field of Classification Search
CPC .............. G06F 1/28; G06F 1/26; G11C 5/148
(Continued)

(56) References Cited

U.S. PATENT DOCUMENTS 5,559,376 A * 9/1996 Tachikawa ................ H02J 1/10
                                                        307/41
7,840,239 B2 * 11/2010 Indiani .................. G06F 1/3287
                                                      455/343.1
(Continued)

FOREIGN PATENT DOCUMENTS

CN      103261991 A    8/2013
JP      3480721 B2    10/2003
(Continued)

OTHER PUBLICATIONS

Chinese First Office Action Dated Mar. 9, 2023, Cited in Corresponding Chinese Application No. CN 201810910391.9.
(Continued)

*Primary Examiner* — Volvick Derose
(74) *Attorney, Agent, or Firm* — Fish & Richardson P.C.

(57) ABSTRACT

A semiconductor device and a power-off method of the semiconductor device, the semiconductor device including a first power source group including first and second power sources, a second power source group including a third power source and a power sequence controller. The power sequence controller performs power-on operations and power-off operations of the first to third power sources. The power sequence controller starts a power-off operation of the first power source group at a first time, and starts a power-off operation of the second power source group when the power voltage of the first power source group becomes a first voltage or when a first reference time has passed from the first time.

19 Claims, 19 Drawing Sheets

Related U.S. Application Data continuation of application No. 16/933,270, filed on Jul. 20, 2020, now Pat. No. 11,379,028, which is a continuation of application No. 15/922,968, filed on Mar. 16, 2018, now Pat. No. 10,725,516.

(51) Int. Cl.
  *G06F 1/28* (2006.01)
  *G11C 5/14* (2006.01)
  *G06F 1/30* (2006.01)
  *G06F 1/3203* (2019.01)

(58) Field of Classification Search
  USPC .......................................................... 713/330
  See application file for complete search history.

(56) References Cited

U.S. PATENT DOCUMENTS

| | | | |
|---|---|---|---|
| 7,952,234 | B2 | 5/2011 | Udo |
| 8,214,670 | B2 | 7/2012 | Ishikura et al. |
| 8,448,001 | B1 | 5/2013 | Zhu et al. |
| 8,680,710 | B2 | 3/2014 | Nogawa |
| 8,726,047 | B2 * | 5/2014 | Lee ............ G06F 1/26 713/320 |
| 8,782,449 | B2 * | 7/2014 | Itakura ............ H02J 3/007 713/320 |
| 9,014,825 | B2 | 4/2015 | Olson et al. |
| 10,725,516 | B2 | 7/2020 | Jeon et al. |
| 2003/0057358 | A1 | 3/2003 | Yuan |
| 2004/0217651 | A1 * | 11/2004 | Brown ............ H02J 1/102 307/31 |
| 2004/0217749 | A1 * | 11/2004 | Orr ............ H02M 3/33569 323/299 |
| 2009/0259864 | A1 | 10/2009 | Li et al. |
| 2009/0315397 | A1 * | 12/2009 | Udo ............ H02M 3/1584 307/31 |
| 2011/0027626 | A1 | 2/2011 | Lattin |
| 2011/0234000 | A1 * | 9/2011 | Yan ............ H02M 3/157 307/31 |
| 2011/0283130 | A1 * | 11/2011 | Pai ............ G06F 1/3287 713/340 |
| 2012/0153992 | A1 * | 6/2012 | Nogawa ............ G06F 1/26 327/76 |
| 2014/0312690 | A1 * | 10/2014 | Olson ............ G06F 1/329 307/29 |
| 2014/0359331 | A1 * | 12/2014 | Kuan ............ G06F 1/263 713/323 |
| 2015/0130533 | A1 * | 5/2015 | Jeon ............ H02J 9/061 327/540 |
| 2015/0316971 | A1 | 11/2015 | Tadepalli et al. |
| 2015/0323978 | A1 | 11/2015 | Ochiai |
| 2016/0018868 | A1 * | 1/2016 | Shimada ............ G06F 1/324 713/322 |
| 2016/0109932 | A1 * | 4/2016 | Jeon ............ G06F 1/3296 713/323 |
| 2016/0109933 | A1 * | 4/2016 | Damle ............ G06F 1/263 713/323 |
| 2016/0274194 | A1 | 9/2016 | Nelson et al. |
| 2016/0363985 | A1 | 12/2016 | Ehmann et al. |
| 2017/0060204 | A1 | 3/2017 | Gangwar et al. |
| 2017/0185094 | A1 * | 6/2017 | Atkinson ............ G06F 1/3243 |
| 2018/0173262 | A1 * | 6/2018 | Yang ............ G05F 1/563 |
| 2019/0064902 | A1 * | 2/2019 | Jeon ............ G06F 1/28 |
| 2022/0302737 | A1 * | 9/2022 | Ohishi ............ H02J 7/0013 |

FOREIGN PATENT DOCUMENTS

| | | | |
|---|---|---|---|
| JP | 2014225678 | A * | 12/2014 |
| JP | 5866415 | | 1/2016 |
| KR | 1585872 | | 1/2016 |

OTHER PUBLICATIONS

Uwe Brckel mann, 金国锋，供电顺序控制方法，国外电子元器件，第 74-75 页．(C) 1994-2023 China Academic Journal Electronic Publishing House.

* cited by examiner

FIG. 6

|  | Priority |
|---|---|
| Power Source 1 | C |
| Power Source 2 | A |
| Power Source 3 | B |
| Power Source 4 | A |
| ⋮ | ⋮ |
| Power Source (n-1) | B |
| Power Source (n) | A |

SEMICONDUCTOR DEVICE AND POWER OFF METHOD OF A SEMICONDUCTOR DEVICE

CROSS-REFERENCE TO RELATED APPLICATIONS

This is a Continuation of U.S. patent application Ser. No. 17/857,526, filed Jul. 5, 2022, which is a Continuation of U.S. patent application Ser. No. 16/933,270, filed Jul. 20, 2020, which is a Continuation of U.S. patent application Ser. No. 15/922,968, filed Mar. 16, 2018, which issued as U.S. Pat. No. 10,725,516 on Jul. 28, 2020, and a claim of priority under 35 U.S.C. § 119 is made to Korean Patent Application No. 10-2017-0108758 filed on Aug. 28, 2017, in the Korean Intellectual Property Office, the entirety of which is hereby incorporated by reference.

BACKGROUND

The inventive concepts described herein relate to semiconductor devices, and more particularly to a method of powering-off semiconductor devices.

In system-on-chips (SoCs), dozens of power sources may be supplied from a power management integrated chip (PMIC) typically having complicated power supply configuration. The dozens of power sources are individually controlled over units of micro-seconds or units of a given time when powered-on.

The reason for controlling the power sources at such a fine level when powered-on is to prevent inrush current and to stably supply power to individual power sources.

However, it is difficult to control the power sources at fine levels during a power-off operation. Since voltage levels of the power sources decrease due to discharge when powered-off, the amount of time to completely power-off the power sources may be delayed differently by an amount of charge charged in capacitors of the power sources, a magnitude of a resistance to be discharged, a magnitude of an external capacitance, or the like.

If power-off control is performed following all the sequences as in a power-on operation, the power-off time may become slower than the power-on time by dozens to several hundred times. This may cause issues such as poor responsiveness or poor reaction speed.

SUMMARY

Embodiments of the inventive concepts provide a semiconductor device with improved power-off responsiveness and reaction speed.

Embodiments of the inventive concepts also provide a power-off method for a semiconductor device with improved responsiveness and reaction speed.

Embodiments of the inventive concepts provide a semiconductor device including a first power source group including first and second power sources; a second power source group including a third power source; and a power sequence controller configured to perform power-on operations and power-off operations of the first to third power sources. The power sequence controller is configured to start the power-off operation of the first power source group at a first time, and to start the power-off operation of the second power source group when a power voltage of the first power source group becomes a first voltage or when a first reference time has passed from the first time.

Embodiments of the inventive concepts provide a semiconductor device including a first power source group including first and second power sources; a second power source group including a third power source; a third power source group including a fourth power source; and a power sequence controller configured to perform power-on operations and power-off operations of the first to fourth power sources. The power sequence controller is configured to start the power-off operation of the first power source group, to start the power-off operation of the second power source group when a power voltage of the first power source group becomes a first voltage, and start the power-off operation of the third power source group when a power voltage of the second power source group becomes a second voltage. The magnitudes of the first voltage and the second voltage are different from each other.

Embodiments of the inventive concepts further provide a semiconductor device including a first power source group including first and second power sources; a second power source group including a third power source; a third power source group including a fourth power source; and a power sequence controller configured to perform power-on operations and power-off operations of the first to fourth power sources. The power sequence controller is configured to start the power-off operation of the first power source group at a first time, to start the power-off operation of the second power source group at a second time when a first reference time has passed from the first time, and to start the power-off operation of the third power source group at a third time when a second reference time has passed from the second time. The length of the first reference time and the second reference time are different from each other.

Embodiments of the inventive concepts further provide a power-off method of a semiconductor device, the semiconductor device including a power sequence controller and a plurality of power sources. The method includes starting, by the power sequence controller, a power-off operation of a first power source group including first and second power sources from among the plurality of power sources; and starting, by the power sequence controller, a power-off operation of a second power source group including a third power source from among the plurality of power sources when a first condition is satisfied. The first condition includes at least one of a condition that a power voltage of the first power source group becomes a first voltage, and a condition that a first reference time has passed since a first time when the power-off operation of the first power source group is started.

Embodiments of the inventive concepts still further provide a power-off method of a semiconductor device, the semiconductor device including a power sequence controller and a plurality of power sources. The method includes starting, by the power sequence controller, a power-off operation of a first power source group including first and second power sources from among the plurality of power sources; starting, by the power sequence controller, a power-off operation of a second power source group including a third power source from among the plurality of power sources when a power voltage of the first power source group becomes a first voltage; and starting, by the power sequence controller, a power-off operation of a third power source group including a fourth power source from among the plurality of power sources when a power voltage of the second power source group becomes a second voltage. The magnitudes of the first voltage and the second voltage are different from each other.

Embodiments of the inventive concepts still further provide a power-off method of a semiconductor device, the semiconductor device including a power sequence controller and a plurality of power sources. The method includes starting, by the power sequence controller, a power-off operation of a first power source group at a first time, the first power source group including first and second power sources from among the plurality of power sources; starting, by the power sequence controller, a power-off operation of a second power source group at a second time, the second power source group including a third power source from among the plurality of power sources; and starting, by the power sequence controller, a power-off operation of a third power source group at a third time, the third power source group including a fourth power source from among the plurality of power sources. The lengths of the first reference time and the second reference time are different from each other.

BRIEF DESCRIPTION OF THE DRAWINGS

The above and other aspects and features of the inventive concepts will become more apparent in view of the following description of exemplary embodiments thereof with reference to the attached drawings, in which:

FIG. 6 illustrates a table explanatory of a priority order for the representative selection of the power source of FIG. 1;

DETAILED DESCRIPTION OF THE EMBODIMENTS

Hereinafter, a semiconductor device according to some embodiments of the inventive concepts will be described with reference to FIGS. 1 to 10.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
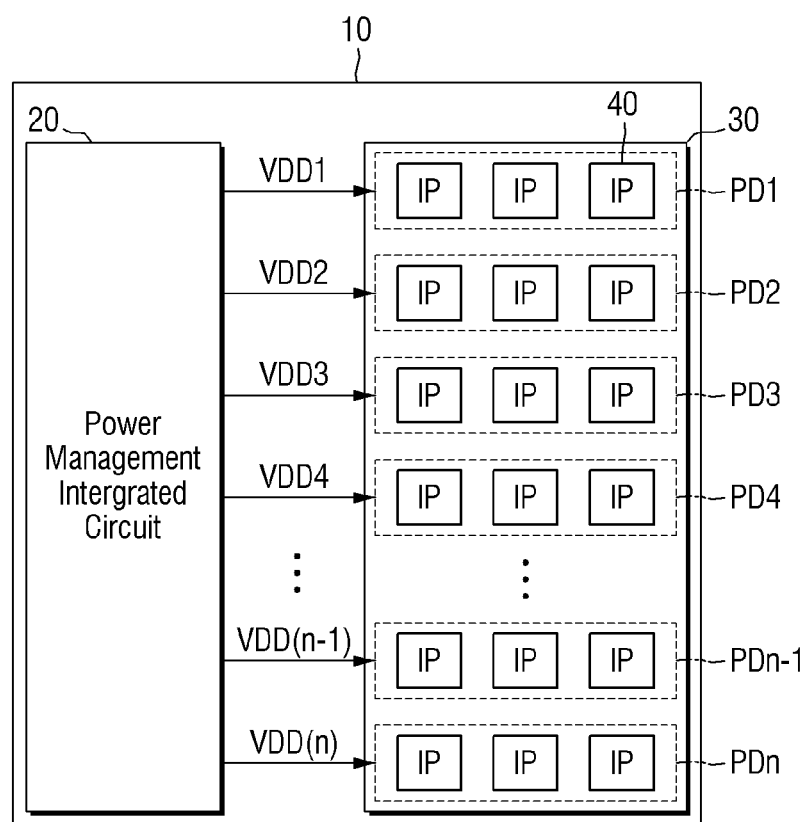
FIG. 1 illustrates a block diagram of a semiconductor device according to some embodiments of the inventive concepts.
Figure 2:
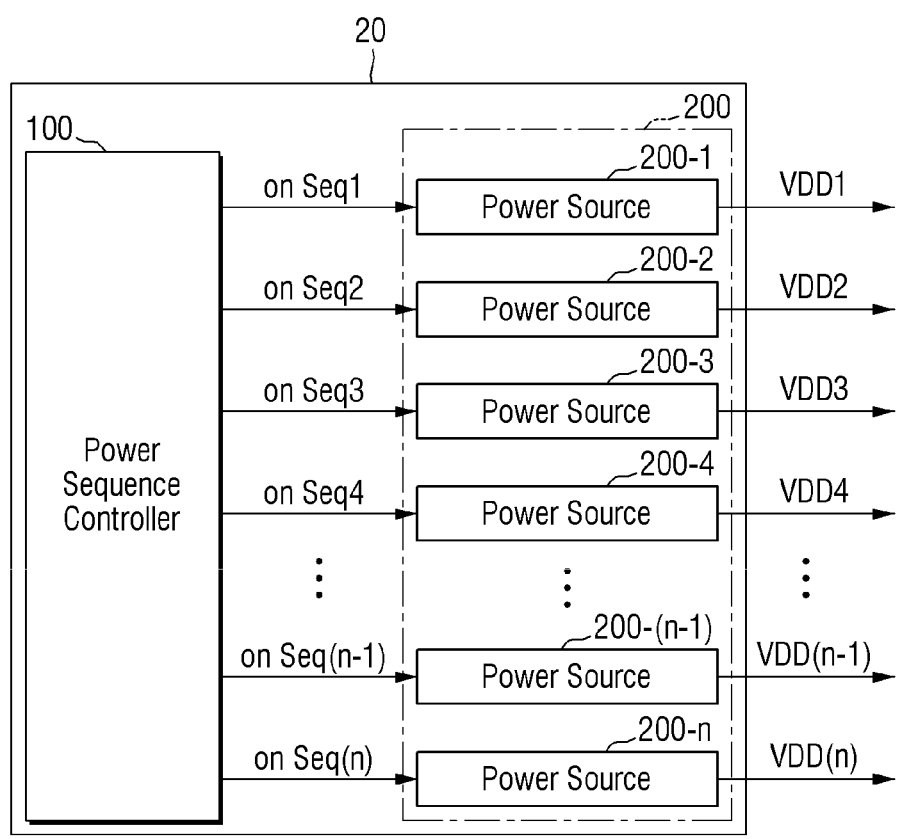
FIG. 2 illustrates a block diagram explanatory of a power-on operation of a power management integrated circuit of FIG. 1 in detail.
Figure 3:
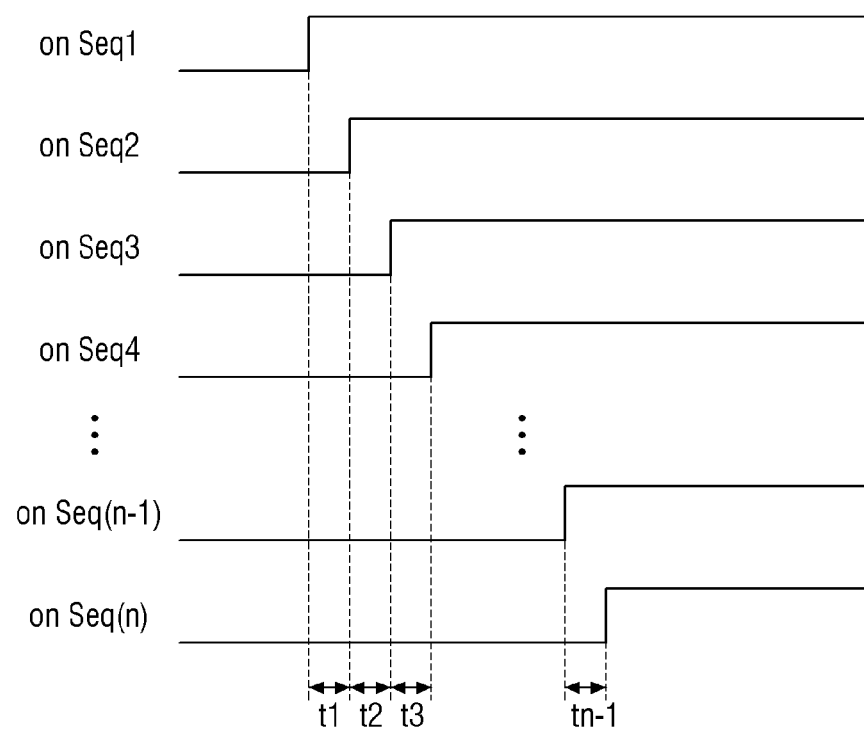
FIG. 3 illustrates a time chart explanatory of a power-on operation of the semiconductor device of FIG. 1.
Figure 4:
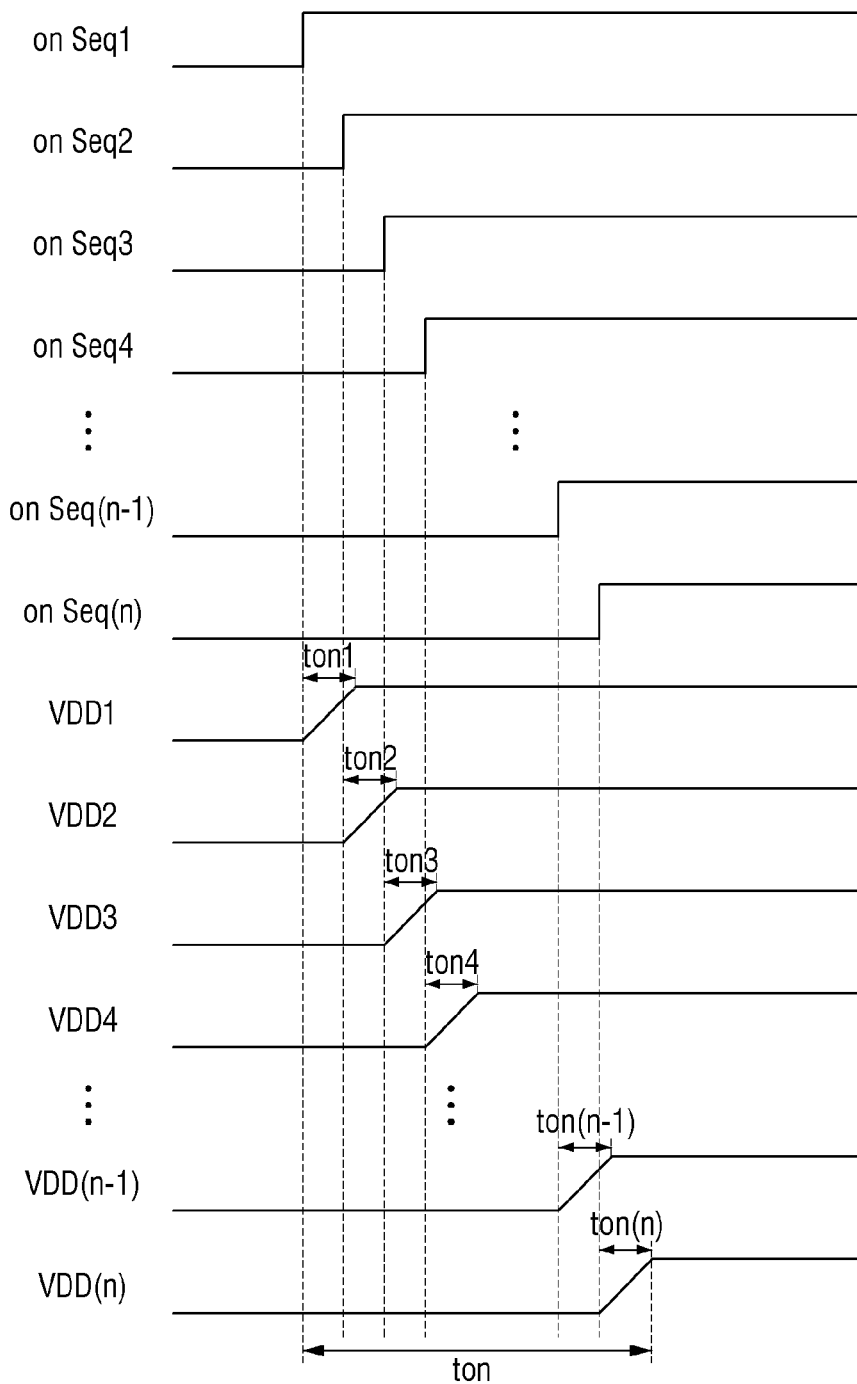
FIG. 4 illustrates a time chart explanatory of a power-on operation of the semiconductor device of FIG. 1.
Figure 5:
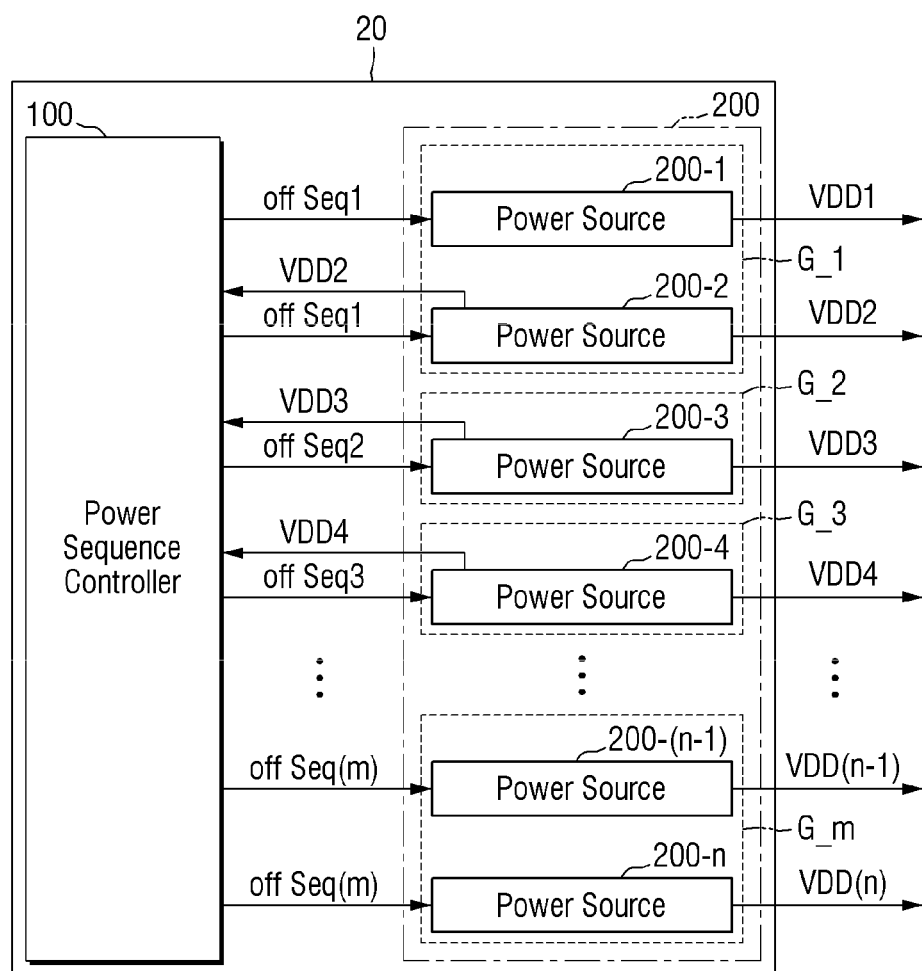
FIG. 5 illustrates a block diagram explanatory of a power-off operation of the power management integrated circuit of FIG. 1 in detail.
Figure 7:
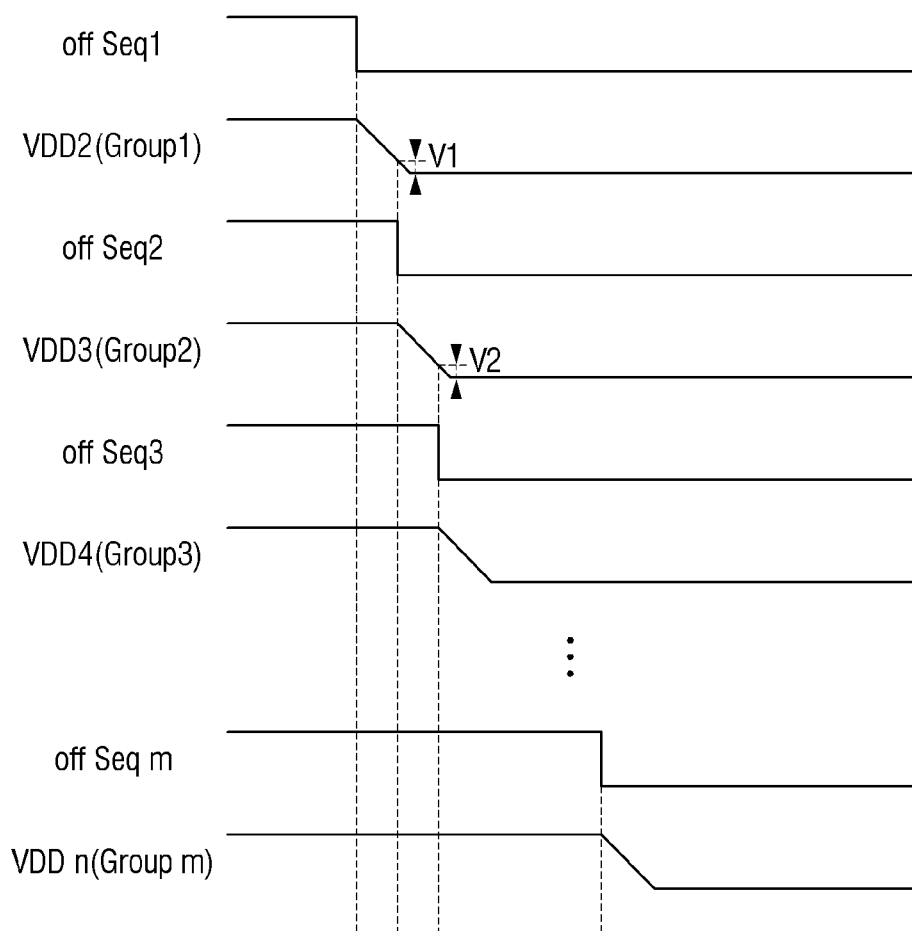
FIG. 7 illustrates a time chart explanatory of a power-off operation of the semiconductor device in FIG. 1.
Figure 8:
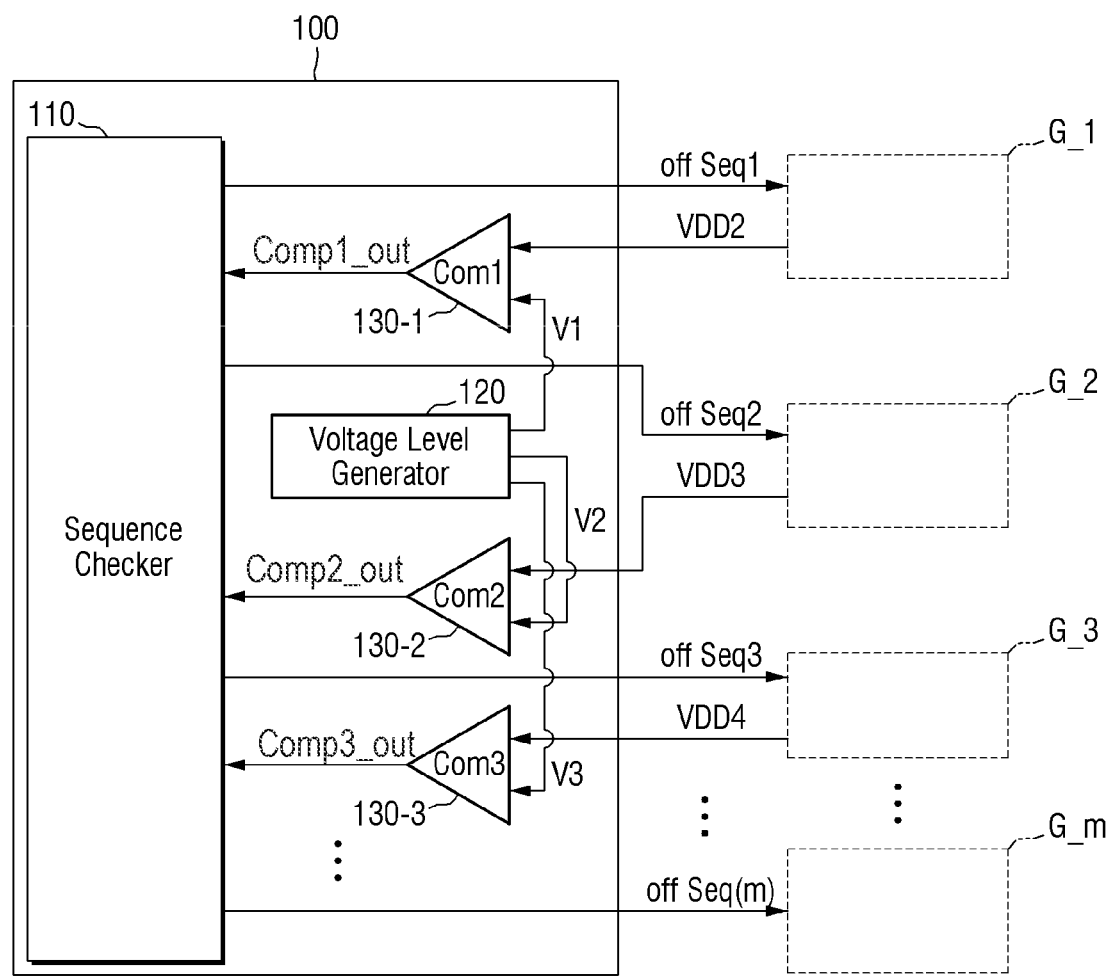
FIG. 8 illustrates a block diagram explanatory of a power-off operation of the power management integrated circuit of FIG. 1 in detail.
Figure 9:
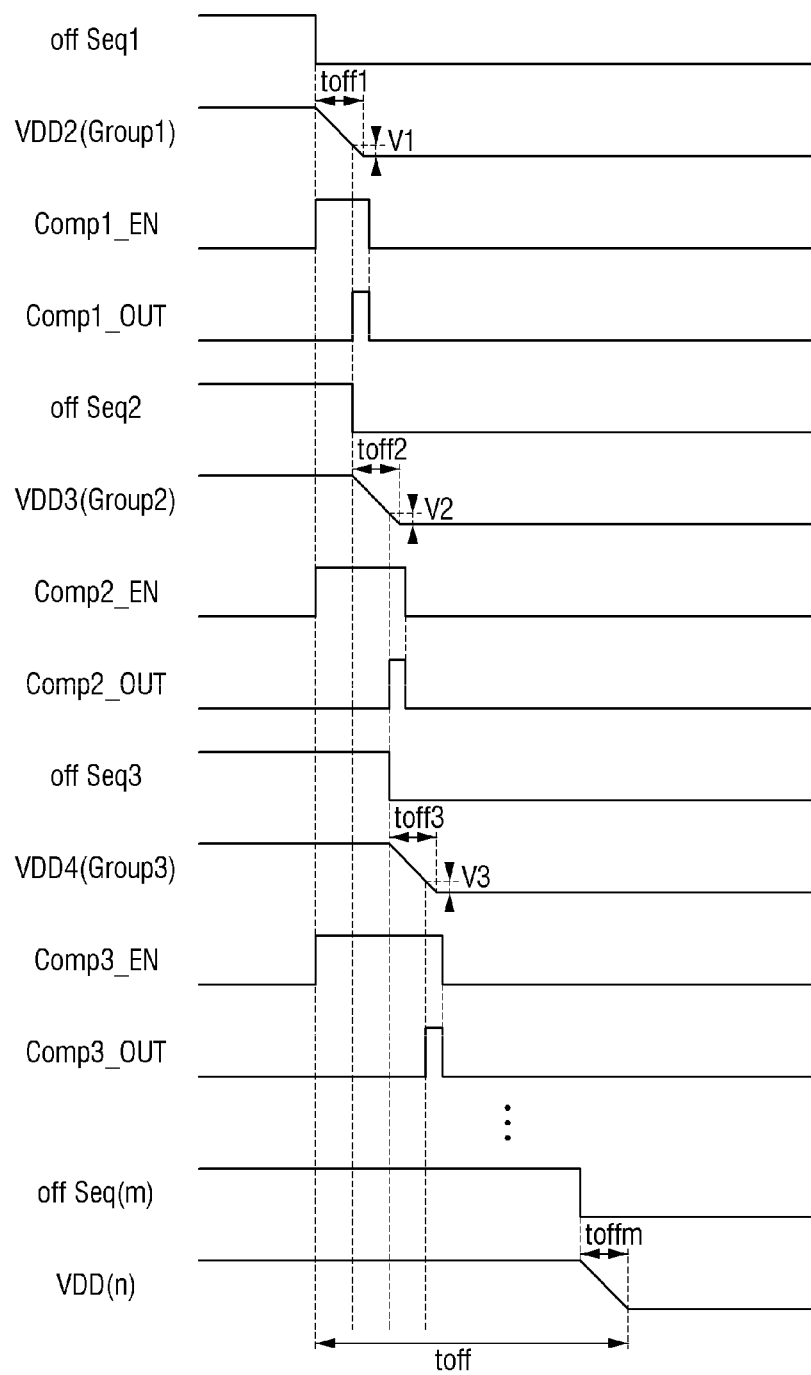
FIG. 9 illustrates a time chart explanatory of a power-off operation of the semiconductor device of FIG. 1.
Figure 10:
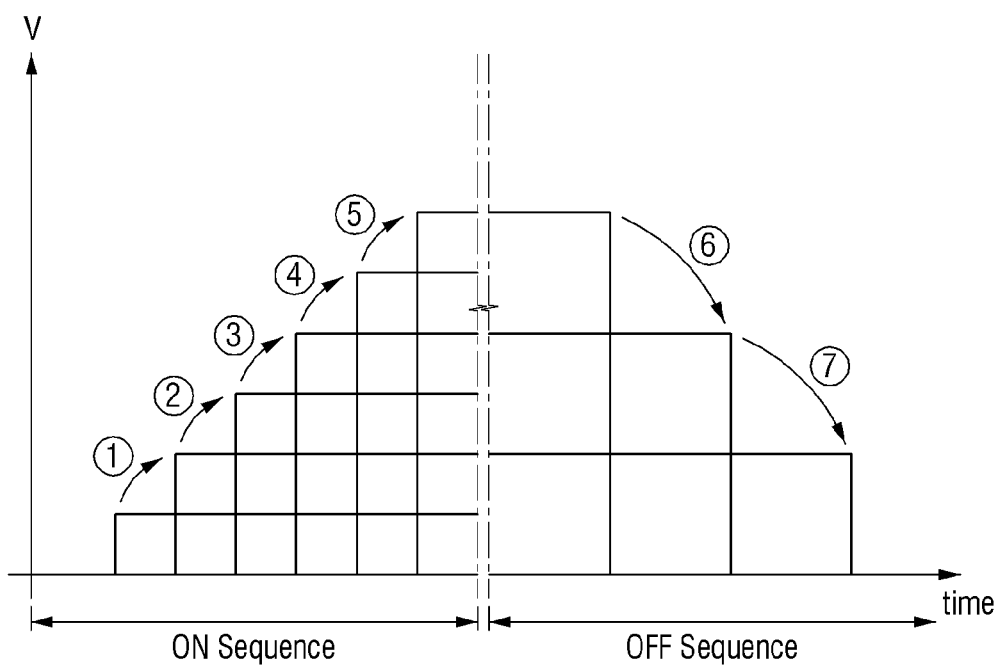
FIG. 10 illustrates a graph of the voltage according to time explanatory of the selection of the magnitude of the reference voltage of FIG. 1.

FIG. 1 illustrates a block diagram of a semiconductor device according to some embodiments of the inventive concepts, and FIG. 2 illustrates a block diagram explanatory of a power-on operation of a power management integrated circuit of FIG. 1 in detail. FIG. 3 illustrates a time chart explanatory of a power-on operation of the semiconductor device of FIG. 1, and FIG. 4 illustrates a time chart explanatory of a power-on operation of the semiconductor device of FIG. 1. FIG. 5 illustrates a block diagram explanatory of a power-off operation of the power management integrated circuit of FIG. 1 in detail, and FIG. 6 illustrates a table explanatory of a priority order for the representative selection of the power source of FIG. 1. FIG. 7 illustrates a time chart explanatory of a power-off operation of the semiconductor device in FIG. 1, and FIG. 8 illustrates a block diagram explanatory of a power-off operation of the power management integrated circuit of FIG. 1 in detail. FIG. 9 illustrates a time chart explanatory of a power-off operation of the semiconductor device of FIG. 1, and FIG. 10 illustrates a graph of the voltage according to time explanatory of the selection of the magnitude of the reference voltage of FIG. 1.

Referring to FIG. 1, a semiconductor device 10 includes a power management integrated circuit (PMIC) 20, and a system-on-chip (SoC) 30.

The power management integrated circuit 20 is located inside the semiconductor device 10 and serves to supply power used by the semiconductor device 10. The power management integrated circuit 20 may supply power to the system-on-chip 30 located inside the semiconductor device 10. The power management integrated circuit 20 may supply power from a battery, an external power supply or the like to the system-on-chip 30. A plurality of voltage domains PD1, PD2, PD3, PD4, . . . PDn-1 and PDn (i.e., PD1 to PDn) of the system-on-chip 30 may receive supply of a plurality of power supply voltages VDD1, VDD2, VDD3, VDD4, . . . VDD(n-1) and VDD(n) (i.e., VDD1 to VDD(n)) from the power management integrated circuit 20. Although six power supply voltages VDD1 to VDD(n) and six corresponding voltage domains PD1 to PDn are specifically shown in FIG. 1, in other embodiments of the inventive concepts any number of appropriate power supply voltages and voltage domains may be provided.

The system-on-chip 30 is located inside the semiconductor device 10. The system-on-chip 30 may receive the supply of power from the power management integrated circuit 20. The system-on-chip 30 may include the aforementioned plurality of voltage domains (PD1 to PDn) therein. Each of the voltage domains (PD1 to PDn) may be a virtual region to which power of the same voltage is supplied. That is, different voltage domains (PD1 to PDn) may receive the supply of power of different voltages. However, in other embodiments of the inventive concepts, only some of the different voltage domains (PD1 to PDn) may be provided with a power supply, and power supply to the remaining voltage domains (PD1 to PDn) may be limited or disabled.

That is, the power management integrated circuit 20 may for example control whether or not to supply power to the plurality of voltage domains (PD1 to PDn), the voltage of the supply power (i.e., the level of the power supply voltage), and the like, respectively.

At least one functional block 40 may exist inside the voltage domains (PD1 to PDn). The functional blocks 40 may be circuits or IPs (Intellectual Property) that perform various functions. For example, the functional blocks 40 may include a central processing unit (CPU), a graphic processing unit (GPU), a bus system, an image signal processor (ISP), a multi-format codec (MFC) block, a file system (FSYS) block, a memory controller (MC), and the like.

Each of the voltage domains (PD1 to PDn) may receive the power supply voltages (VDD1 to VDD(n)) from the power management integrated circuit 20. For example, the first voltage domain (PD1) is supplied with the first power supply voltage (VDD1), and the second voltage domain (PD2) is supplied with the second power supply voltage (VDD2). The third voltage domain (PD3) is supplied with the third power supply voltage (VDD3), and the fourth voltage domain (PD4) is supplied with the fourth power supply voltage (VDD4). Similarly, the n-1$^{st}$ power supply voltage (VDDn-1) is supplied with the n-1$^{st}$ voltage domain (PD (n-1)), and the n-th voltage domain (PDn) is supplied with the n-th power supply voltage (VDD(n)).

In the semiconductor device 10 of FIG. 1, the power management integrated circuit 20 is illustrated as being located outside the system-on-chip 30, but the location of the power management integrated circuit 20 is not limited as shown in FIG. 1. That is, according to some embodiments of the inventive concepts, the power management integrated circuit 20 may be located inside the system-on-chip 30. In such a case, the power management integrated circuit 20 may also directly control the voltage domain including itself.

Referring to FIG. 2, the power management integrated circuit 20 includes a first power sequence controller 100 and a power source 200.

The first power sequence controller 100 may transmit on-sequence signals on Seq1, on Seq2, on Seq3, on Seq4, . . . on Seq(n-1) and on Seq(n) (i.e., on Seq1 to on Seq(n)) to the power source 200. The on-sequence signals (on Seq1 to on Seq(n)) may each be a signal that instructs the start of a power-on operation.

The power source 200 may include first to n-th power sources 200-1, 200-2, 200-3, 200-4, . . . 200-(n-1) and 200-n (i.e., 200-1 to 200-n). The first to n-th power sources (200-1 to 200-n) may supply the power supply voltages (VDD1 to VDD(n)), respectively. That is, the first power source 200-1 supplies the first power supply voltage (VDD1), and the second power source 200-2 supplies the second power supply voltage (VDD2). The third power source 200-3 supplies the third power supply voltage (VDD3), and the fourth power source 200-4 supplies the fourth power supply voltage (VDD4). The n-th power source (200-(n-1)) supplies the n-1$^{st}$ power supply voltage (VDD(n-1)), and the n-th power source (200-(n)) supplies the n-th power supply voltage (VDD(n)).

In FIG. 2, a physically distinguished one power source 200 is illustrated as supplying power to one voltage domain (PD1 to PDn), but the inventive concepts are not limited thereto. That is, in other embodiments of the inventive concepts, each power source 200 may be configured so that a plurality of physically distinguished power sources is simultaneously controlled to operate as a single power source 200.

The first power sequence controller 100 may transmit the on-sequence signals (on Seq1 to on Seq(n)) to the first to n-th power sources (200-1 to 200-n). For example, the first on-sequence signal (on Seq1) may be transmitted to the first power source 200-1, and the second on-sequence signal (on Seq2) may be transmitted to the second power source 200-2. The third on-sequence signal (on Seq3) may be transmitted to the third power source 200-3, and the fourth on-sequence signal (on Seq4) may be transmitted to the fourth power source 200-4. The n-1$^{st}$ on-sequence signal (on Seq (n-1)) may be transmitted to the n-1$^{st}$ power source (200-(n-1)), and the n-th on-sequence signal (on Seq(n)) may be transmitted to the n-th power source 200-n.

Referring to FIG. 2 and FIG. 3, the on-sequence signals (on Seq1 to on Seq(n)) may be sequentially transmitted to the power source 200. That is, the first on-sequence signal (on Seq1) may be transmitted first. Since the on-sequence signals (on Seq1 to on Seq(n)) are control signals, they may be voltages of logical "high" and "low" levels provided by a digital circuit. The on-sequence signals may be transmitted via an operation in which the "high" and "low" voltages levels inversely change with respect to each other. In FIG. 3, the on-sequence signals (on Seq1 to on Seq(n)) may be transmitted to turn on a corresponding power source (200-1 to 200-n) at a timing when a "low" voltage changes to a "high" voltage. However, in some embodiments of the inventive concepts, the on-sequence signals (on Seq1 to on Seq(n)) may in contrast be transmitted to turn on a corresponding power source (200-1 to 200-n) at a timing when a "high" voltage changes to a "low" voltage.

When the first on-sequence signal (on Seq1) is transmitted and the first interval (t1) has passed, the first power sequence controller 100 may transmit the second on-sequence signal (on Seq2) to the second power source 200-2. Subsequently, when the second interval (t2) has passed, the third on-sequence signal (on Seq3) may be transmitted to the third power source 200-3 by the first power sequence controller 100. Similarly, when the n−$1^{st}$ sequence signal (on Seq (n−1)) is transmitted and the n−$1^{st}$ interval (tn−1) has passed, the first power sequence controller 100 may transmit the n-th sequence signal (on Seq(n)) to the power source 200-n. In this manner, the on-sequence signals (on Seq1 to on Seq(n)) may be sequentially transferred to the first to n-th power sources (200-1 to 200-n).

The first to n−$1^{st}$ intervals (t1 to tn−1) as shown in FIG. 3 may be the same. However, in some embodiments of the inventive concept, the first to n−$1^{st}$ intervals (t1 to tn−1) may differ from each other. That is, the lengths (i.e., durations) of the first to n−$1^{st}$ intervals (t1 to tn−1) may be individually determined in accordance with several procedures of the power-on operation. The first to n−$1^{st}$ intervals (t1 to tn−1) may be determined in accordance with a change in voltage, as will be subsequently described.

Referring to FIGS. 2 and 4, the power supply voltages (VDD1 to VDD(n)) may change responsive to the on-sequence signals (on Seq1 to on Seq(n)). That is, when the first power sequence controller 100 transmits the on-sequence signals (on Seq1 to on Seq(n)) to the power source 200, the power source 200 may start raising the power supply voltages (VDD1 to VDD) to a power-on level. Since the on-sequences signals (on Seq1 to on Seq(n)) are sequentially transmitted, an operation in which the power supply voltages (VDD1 to VDD(n)) rise to the power-on level may also be sequentially started.

For example, when the first on-sequence signal (on Seq1) is transmitted by the first power sequence controller 100, the first power source 200-1 may start raising the first power supply voltage (VDD1) to the power-on level. The first power supply voltage (VDD1) may reach the power-on level by the first on-time (ton 1) from the power-off level.

Subsequently, when the second on-sequence signal (on Seq2) is transmitted by the first power sequence controller 100, the second power source 200-2 may start raising the second power supply voltage (VDD2) to a power-on level. The second power supply voltage (VDD2) may reach the power-on level by the second on-time (ton2) from the power-off level.

Subsequently, when the third on-sequence signal (on Seq3) is transmitted by the first power sequence controller 100, the third power source 200-3 may start raising the third power supply voltage (VDD3) to the power-on level. The third power supply voltage (VDD3) may reach the power-on level by the third on time (ton3) from the power-off level.

Subsequently, when the fourth on-sequence signal (on Seq4) is transmitted by the first power sequence controller 100, the fourth power source 200-4 may start raising the fourth power supply voltage (VDD4) to the power-on level. The fourth power supply voltage (VDD4) may reach the power-on level by the fourth time (ton4) from the power-off level.

In this way, when the process proceeds and the n−$1^{st}$ on-sequence signal (on Seq(n−1)) is transmitted by the first power sequence controller 100, the n−$1^{st}$ power source (200-(n−1)) may raise the n−$1^{st}$ power supply voltage (VDD(n−1)) to the power-on level. The n−$1^{st}$ power supply voltage (VDD(n−1)) may reach the power-on level by the n−$1^{st}$ time (ton(n−1)) from the power-off level.

Subsequently, when the process proceeds and the n-th on-sequence signal (on Seq(n)) is transmitted by the first power sequence controller 100, the n-th power source (200-n) may start raising the n-th power supply voltage (VDD(n)) to the power-on level. The n-th power supply voltage (VDD(n)) may reach the power-on level by the n-th on-time (ton(n)) from the power-off level.

Referring to FIGS. 2 to 4, the first to n−$1^{st}$ intervals (t1 to tn−1) and the first to n-th on times (ton1 to ton(n)) are, for example, in units of microseconds, respectively. Therefore, the on-time (ton), which is the time at which the power source 200 performs and completes the power-on operation, may also be in the unit of microseconds. The on-time (ton) may be a relatively shorter time than the time at which the power-off operation to be described later is executed. However, the inventive concepts are not limited as here described, and in other embodiments the first to n−$1^{st}$ intervals (t1 to tn−1) and the first to n-th on times (ton1 to ton(n)) may be in units larger or smaller than microseconds.

The power-on operation of the semiconductor device according to some embodiments of the inventive concepts may progress through fine steps within a short period of time to prevent an occurrence of inrush current, and may stably perform the power supply in accordance with the successive degree of dependence of the power source. In other words, turning on of the first to n-th power sources (200-1 to 200-n) may sequentially progress in fine steps or intervals to sequentially provide the power supply voltages (VDD1 to VDD(n)).

Referring to FIG. 5, the first power sequence controller 100 may transmit the off-sequence signals (off Seq1 to off Seq(m)) to the power source 200. The off-sequence signals (off Seq1 to off Seq(m)) may each be a signal that instructs the start of a power-off operation.

The power source 200 may include a plurality of groups (i.e., power source groups). For example, the power source 200 may include first to m-th groups G_1, G_2, G_3, ... and G_m (i.e., G_1 to G_m). The first to m-th groups G_1 to G_m may be characterized as power source groups. Each group may include at least one of the first to n-th power sources (200-1 to 200-n). As an example, the first group (G_1) includes a first power source 200-1 and a second power source 200-2, and the second group (G_2) includes a third power source 200-3. The third group (G_3) includes a fourth power source (200-4). The m-th group (G_m) includes the n−$1^{st}$ power source (200-(n−1)) and the n-th power source (200-n).

The aforementioned configuration of the groups as shown in FIG. 5 is an example. In some embodiments of the inventive concepts, one group may include three or more power sources among the first to n-th power sources (200-1 to 200-n). That is, the number of power sources included in one group should not be limited and may be any number greater than two.

The first power sequence controller 100 may transmit the first off-sequence signal (off Seq1) to the first group (G_1). That is, the first power sequence controller 100 may simultaneously transmit the first off-sequence signal (off Seq1) to the first power source 200-1 and the second power source 200-2 belonging to the first group (G_1).

Further, the first power sequence controller 100 may transmit the second off-sequence signal (off Seq2) to the third power source 200-3 of the second group (G_2). The first power sequence controller 100 may transmit the third off-sequence signal (off Seq3) to the fourth power source 200-4 of the third group (G_3). Likewise, the first power sequence controller 100 may simultaneously transmit the m-th off-sequence signal (off Seq(m)) to the n−$1^{st}$ power source (200-(n−1)) and the n-th power source (200-n) belonging to the m-th group (G_m).

All the groups excluding the last m-th group (G_m) among the first to m-th groups (G_1 to G_m) may provide a representative power supply voltage to the first power sequence controller 100, respectively. As the representative power supply voltage, one of the power sources belonging to each group may be selected as the representative, and the power supply voltage of the power source may be defined as the representative power supply voltage.

For example, the second power supply voltage (VDD2) of the second power source 200-2 is the representative power supply voltage in the first group (G_1), and the third power supply voltage (VDD3) of the third power source 200-3 is the representative power supply voltage in the second group (G_2). In the third group (G_3), the fourth power supply voltage (VDD4) of the fourth power source 200-4 is the representative power supply voltage. Since the m-th group (G_m) is the last group, it is not necessary to define and transmit a representative power supply voltage to the first power sequence controller 100.

There are various ways to define the representative power supply voltage. For example, there may be a way of arbitrarily selecting the representative power supply voltage. One group among the first to m-th groups (G_1 to G_m) may have higher efficiency when adjacent power sources 200-1 to 200-n are formed in the semiconductor device 10. Therefore, when the group is formed by the adjacent power sources, since there is a high possibility that the voltage levels of the power sources within the group are at a similar level, there is no major problem even if the above representative power supply voltage is arbitrarily selected.

As another way, the representative power supply voltage may be defined in accordance with the power-off time, that is, the time at which the power-off is completed from the start of the power-off operation. First, the power-off operation start time of the next group may be determined in accordance with the representative power supply voltage value of the group in which the power-off operation is started. As a result, the power supply voltages (VDD1 to VDD(n)) of the power sources 200-1 to 200-n having the longest power-off time are selected as the representative power supply voltage, and after the power-off operation of the preceding group progresses considerably, the power-off operation of the next group may be executed, thereby enhancing the stability of the semiconductor device.

As still another way, a way of predefining the priority of the power sources 200-1 to 200-n may also be adopted. Referring to FIG. 6, the rank of the priority of the power sources 200-1 to 200-n may be determined in advance. That is, in FIG. 6 power source 1, power source 2, power source 3, power source 4, power source (n−1) and power source (n) respectively correspond to power source 200-1, power source 200-2, power source 200-3, power source 200-4, power source 200-(n−1) and power source 200-n shown in FIG. 5. The priority may be set in advance, by generally determining the stability of each of the power sources 200-1 to 200-n, and the importance of the voltage domains (PD1 to PDn) in which each of the power sources 200-1 to 200-n supplies power supply voltages (VDD1 to VDD(n)).

This makes it possible to select the power supply voltages (VDD1 to VDD(n)) of the power sources 200-1 to 200-n having the higher priority in the first to m-th groups (G_1 to G_m) as the representative power supply voltages. For example, in the first group (G_1) to which the first power source 200-1 and the second power source 200-2 belong, the priority of the second power source 200-2 is higher (A>C), so that the second power supply voltage (VDD2) of the second power source 200-2 may be selected as the representative power supply voltage of the first group (G_1). Since the second group (G_2) and the third group (G_3) respectively include only the third power source 200-3 and only the fourth power source 200-4, the third power supply voltage (VDD3) and the fourth power supply voltage (VDD4) may be defined as the representative power supply voltages, respectively. Finally, in the case of the m-th group (G_m) to which the n−$1^{st}$ power source (200-(n−1)) and the n-th power source (200-n) belong, the priority of the n-th power source (200-n) is higher (A>B). However, since the m-th group (G_m) is the last group that does not require the definition of the representative power supply voltage, it is unnecessary to select a representative power supply voltage.

Referring to FIGS. 5 and 7, the representative power supply voltage may change responsive to the off-sequence signals (off Seq1 to off Seq(m)). That is, when the first power sequence controller 100 transmits the off-sequence signals (off Seq1 to off Seq(m)) to the power source 200, the power source 200 may start lowering the power supply voltages (VDD1 to VDD(n)) to the power-off level. Since the off-sequences signals (off Seq1 to off Seq(m)) are sequentially transmitted, the operation of lowering the power supply voltages (VDD1 to VDD(n)) to the power-off level may also be sequentially started.

For example, when the first off-sequence signal (off Seq1) is transmitted by the first power sequence controller 100, the first power source 200-1 and the second power source 200-2 of the first group (G_1) may start lowering the first power supply voltage (VDD1) and the second power supply voltage (VDD2) to the power-off level. The second off-sequence signal (off Seq2) may be transmitted when the level of the second power supply voltage (VDD2) as the representative power supply voltage is equal to the first reference voltage (V1).

When the second off-sequence signal (off Seq2) is transmitted by the first power sequence controller 100, the third power source 200-3 of the second group (G_2) may start lowering the third power supply voltage (VDD3) to the power-off level. The third off-sequence signal (off Seq3) may be transmitted when the level of the third power supply voltage (VDD3) as the representative power supply voltage is equal to the second reference voltage (V2).

When the third off-sequence signal (off Seq3) is transmitted by the first power sequence controller 100, the fourth power source 200-4 of the third group (G_3) may start lowering the fourth power supply voltage (VDD4) to the power-off level. When the level of the fourth power supply voltage (VDD4), which is the representative power supply voltage of the third group (G_3), drops to the preset reference voltage, the off-sequence signal from among the off-sequence signals (off Seq1 to off Seq(m)) of the next group may be transmitted.

Finally, when the m-th off-sequence signal (off Seq(m)) is transmitted by the first power sequence controller 100, the n−$1^{st}$ power source (200-(n−1)) and the n-th power source (200-n) of the m-th group (G_m) may start lowering the n−$1^{st}$ power supply voltage (VDD(n−1)) and the n-th power supply voltage (VDD(n)) to the power-off level.

Referring to FIGS. 8 and 9, the first power sequence controller 100 may include a sequence checker 110, a voltage level generator 120, and comparators 130-1, 130-2, and 130-3.

The sequence checker 110 generates the off-sequence signals (off Seq1 to off Seq(m)) and transmits them to the first to m-th groups (G_1 to G_m). The sequence checker 110 determines the transmission time of the off-sequence signals (off Seq1 to off Seq(m)), using the outputs of the comparators 130-1, 130-2, and 130-3.

The voltage level generator 120 generates the levels of preset reference voltages (V1 to V3). Here, based on the reference voltages (V1 to V3) and in a manner as described with reference to FIG. 7 for example, a power-off operation of a next group from among the groups (G_1 to G_n) is performed when the level of the representative power supply voltage of the group immediately preceding the next group reaches the corresponding reference voltage for the immediately preceding group. These reference voltages (V1 to V3) may be generated by the voltage level generator 120 and distributed to the comparators 130-1, 130-2, and 130-3.

The power-off operation of the semiconductor device according to some embodiments of the inventive concept will be described as follows. First, the sequence checker 110 transmits the first off-sequence signal (off Seq1) to the first group (G_1). Subsequently, the first group (G_1) sends the second power supply voltage (VDD2) which is the representative power supply voltage to the first comparator 130-1. At this time, the voltage level generator 120 sends the first reference voltage (V1) to the first comparator 130-1 (Com1).

The first comparator 130-1 compares the first reference voltage (V1) with the second power supply voltage (VDD2), and sends the first output signal (Comp1_OUT) to the sequence checker 110 when the first reference voltage (V1) and the second power supply voltage (VDD2) are the same. The sequence checker 110 transmits the second off-sequence signal (off Seq2) to the second group (G_2) responsive to the first output signal (Comp1_OUT).

Subsequently, the second group (G_2) sends the third power supply voltage (VDD3) which is the representative power supply voltage to the second comparator 130-2 (Com3). At this time, the voltage level generator 120 sends the second reference voltage (V2) to the second comparator 130-2.

The second comparator 130-2 compares the second reference voltage (V2) with the third power supply voltage (VDD3), and sends the second output signal (Comp2_OUT) to the sequence checker 110 when the second reference voltage (V2) and the third power supply voltage (VDD3) are the same. The sequence checker 110 transmits the third off-sequence signal (off Seq3) to the third group (G_3) responsive to the second output signal (Comp2_OUT).

Subsequently, the third group (G_3) transmits the fourth power supply voltage (VDD4) which is the representative power supply voltage to the third comparator (Com3) 130-3. At this time, the voltage level generator 120 sends the third reference voltage (V3) to the third comparator 130-3.

The third comparator 130-3 compares the third reference voltage (V3) with the fourth power supply voltage (VDD4), and sends the third output signal (Comp3_OUT) to the sequence checker 110 when the third reference voltage (V3) and the fourth power supply voltage (VDD4) are the same. The sequence checker 110 may send the next off-sequence signal from among the off-sequence signals (off Seq1 to off Seq(m)) responsive to the third output signal (Comp3_OUT).

In this way, the sequence checker 110 may send the m-th off-sequence signal (off Seq(m)) to the m-th group (G_m) which is the last group.

Specifically, unlike the on-sequence signals (on Seq1 to on Seq(n)), the off-sequence signals (off Seq1 to off Seq(m)) may be transmitted as a "high" voltage level changing to a "low" voltage level. However, the inventive concepts are not limited as described, and in some embodiments the opposite case is also possible whereby the off-sequence signals (off Seq1 to off Seq(m)) may be transmitted as a "low" voltage level changing to a "high" voltage level.

Enable signals (Comp1_EN to Comp3_EN) of the comparators 130-1, 130-2, and 130-3 (not shown in FIG. 8) may be provided by the sequence checker 110 and set to "high", while the first off-sequence signal (off Seq1) is transmitted. The enable signals (Comp1_EN to Comp3_EN) are signals defining the operation of the comparators 130-1, 130-2, and 130-3. The comparators 130-1, 130-2, and 130-3 are operated when the enable signals (Comp1_EN to Comp3_EN) are "high". However, the inventive concepts are not limited as described, and the opposite case is also possible whereby the comparators 130-1, 130-2, and 130-3 are operated when the enable signals (Comp1_EN to Comp3_EN) are "low". The "high" time of the enable signals (Comp1_EN to Comp3_EN) does not necessarily need to be synchronized with the time of transmission of the first off-sequence signal (off Seq1). However, when the "high" time of the enable signals (Comp1_EN to Comp3_EN) is synchronized with the transmission time of the first off-sequence signal (off Seq1), power consumed by the comparators 130-1, 130-2, and 130-3 may be minimized.

The enable signals (Comp1_EN to Comp3_EN) may be changed to "low" after a certain period of time from the application of the output signals (Comp1_OUT to Comp3_OUT). The output signals (Comp1_OUT to Comp3_OUT) may also be returned to "low" by these enable signals (Comp1_EN to Comp3_EN). Therefore, the output signals (Comp1_OUT to Comp3_OUT) may be in the form of a pulse generated once. However, the inventive concepts are not limited as described, and the output signals (Comp1_OUT to Comp3_OUT) may be in a form other than a single generated pulse.

For example, when the first off-sequence signal (off Seq1) is transmitted, the level of the second power supply voltage (VDD2), which is the representative power supply voltage of the first group (G_1), may start to drop to the power-off level. At this time, the first enable signal (Comp1_EN) of the first comparator 130-1 may have already been applied. When the second power supply voltage (VDD2) drops to a preset first reference voltage (V1), the first output signal (Comp1_OUT) of the first comparator 130-1 may be applied. Subsequently, the first enable signal (Comp1_EN) of the first comparator 130-1 is changed to "low" and the first output signal (Comp1_OUT) may also be changed to "low" at the same time. On the other hand, the second off-sequence signal (off Seq2) may be transmitted to the second group (G_2) at the time when the first output signal (Comp1_OUT) is applied.

Subsequently, when the second off-sequence (off Seq2) is transmitted, the level of the third power supply voltage (VDD3), which is the representative power supply voltage of the second group (G_2), may start to drop to the power-off level. At this time, the second enable signal (Comp2_EN) of the second comparator 130-2 may already have been applied. When the third power supply voltage (VDD3) drops to the preset second reference voltage (V2), the second output signal (Comp2_OUT) of the second comparator 130-2 may be applied. Subsequently, the second enable signal (Comp2_EN) of the second comparator 130-2 is changed to "low" and the second output signal (Comp2_OUT) may also be changed to "low" at the same time. On the other hand, the third off-sequence signal (off Seq3) may be transmitted to the third group (G_3) at the time when the second output signal (Comp2_OUT) is applied.

Subsequently, when the third off-sequence signal (off Seq3) is transmitted, the level of the fourth power supply voltage (VDD4), which is the representative power supply voltage of the third group (G_3), may start dropping to the power-off level. At this time, the third enable signal (Comp3_EN) of the third comparator 130-3 may already have been applied. When the fourth power supply voltage (VDD4) drops to a preset third reference voltage (V3), the third output signal (Comp3_OUT) of the third comparator 130-3 may be applied. Subsequently, the third enable signal (Comp3_EN) of the third comparator 130-3 is changed to "low", and the third output signal (Comp3_OUT) may also be changed to "low" at the same time.

In this way, when the m-th off-sequence signal (off Seq(m)) is transmitted, the level of the n-th power supply voltage (VDD(n)) of the m-th group (G_m) may start to drop to the power-off level.

The second power supply voltage (VDD2), which is the representative power supply voltage of the first group (G_1), may be subjected to power-off operation during the first off-time (toff1). The third power supply voltage (VDD3), which is the representative power supply voltage of the second group (G_2), may be subjected to power-off operation during the second off-time (toff2). The fourth power supply voltage (VDD4), which is the representative power supply voltage of the third group (G_3), may be subjected to power-off operation during the third off-time (toff3). The n-th power supply voltage (VDD(n)) of the m-th group (G_m) may be subjected to power-off operation during the m-th off-time (toffm).

The first to m-th off-times (toff1 to toffm) may be, for example, in unit of milliseconds (ms). The off-time (toff) taken for the power-off operation may also be in units of milliseconds, in accordance with the first to m-th off-times (toff1 to toffm). The off-time (toff) may be dozens of times to several hundred times longer than the above-mentioned on-time (ton). However, the inventive concepts are not limited as here described, and in other embodiments the first to m-th off-times (toff1 to toffm) may be in units larger or smaller than milliseconds.

In the case of a power-off operation, discharge of capacitors within the power sources 200-1 to 200-n is required as compared with the power-on operation, which inevitably requires more time. Therefore, in the case of executing the power-off operation with fine control such as in the power-on operation, the whole time of the power-off operation becomes too long, which may greatly hinder the responsiveness and speed of the semiconductor device.

Therefore, the semiconductor device according to some embodiments of the inventive concepts groups a plurality of power sources to perform a power-off operation for each group, thereby reducing the length of the power-off stage, and sets the start time of the power-off operation at each stage in a cascading manner such that the stability of the power-off operation may be maintained.

All the reference voltages (V1 to V3) such as shown in FIG. 9 may have the same value. However, in some embodiments of the inventive concepts, the reference voltages (V1 to V3) may have different values for each group.

For example, in some embodiments of the inventive concepts the first reference voltage (V1) may be greater than the second reference voltage (V2), and the second reference voltage (V2) may be greater than the third reference voltage (V3). That is, the reference voltages (V1 to V3) of preceding groups may be greater than the reference voltages (V1 to V3) of next or following groups.

Referring to FIG. 10, the power-on operation (On sequence) and the power-off operation (Off sequence) of the semiconductor device are exemplarily illustrated. That is, the power-on operation (On sequence) is performed first on the voltage domain of the lower power supply voltage, and the power-on operation is then performed on the voltage domain of the gradually higher power supply voltages (①, ②, ③, ④, and ⑤).

The power-off operation (Off sequence) is performed first on the power of the higher power supply voltage, and the power-off operation is then performed on the voltage domain of the gradually lower power supply voltages (⑥ and ⑦). The procedure of the power-off operation may be simplified by grouping as compared with the procedure of the power-on operation.

A type of operation in which the power supply voltage level gradually rises and falls as described above may improve the overall stability and efficiency of the semiconductor device, since the sequential variation of the voltage level is allowed. That is, the power-off operation of the voltage domain of higher voltage is performed first in the power-off operation, and thereafter, the power-off operation of the voltage domain having the lower power supply voltage may be performed.

Accordingly, the reference voltages (V1 to V3) may also be set accordingly. The reference voltages (V1 to V3) may be set in the off-region in which the elements of the voltage domains (PD1 to PDn) are not operated. To this end, the reference voltages (V1 to V3) may be set in proportion to the magnitude of the level of the power supply voltages (VDD1 to VDD(n)).

As a result, the first reference voltage (V1) of the first group (G_1) in which the power-off operation is performed first may be greater than the second reference voltage (V2) of the second group (G_2). Similarly, the second reference voltage (V2) may be greater than the third reference voltage (V3). That is, the voltage level generator 120 may generate respective voltage levels of gradually lower levels for each of the comparators 130-1, 130-2, and 130-3.

The semiconductor device according to the present embodiment may clearly reduce the time necessary for the power-off operation, and may greatly improve the response speed and responsiveness of the semiconductor device accordingly. Furthermore, the semiconductor device may also maintain stability of the power-off operation.

Hereinafter, referring to FIG. 11, a semiconductor device according to some embodiments of the inventive concepts will be described. Description of configuration and functionality of parts of the semiconductor device of this embodiment similar to that of the semiconductor device described with respect to FIGS. 1-10 may be omitted or simplified in the following.

Figure 11:
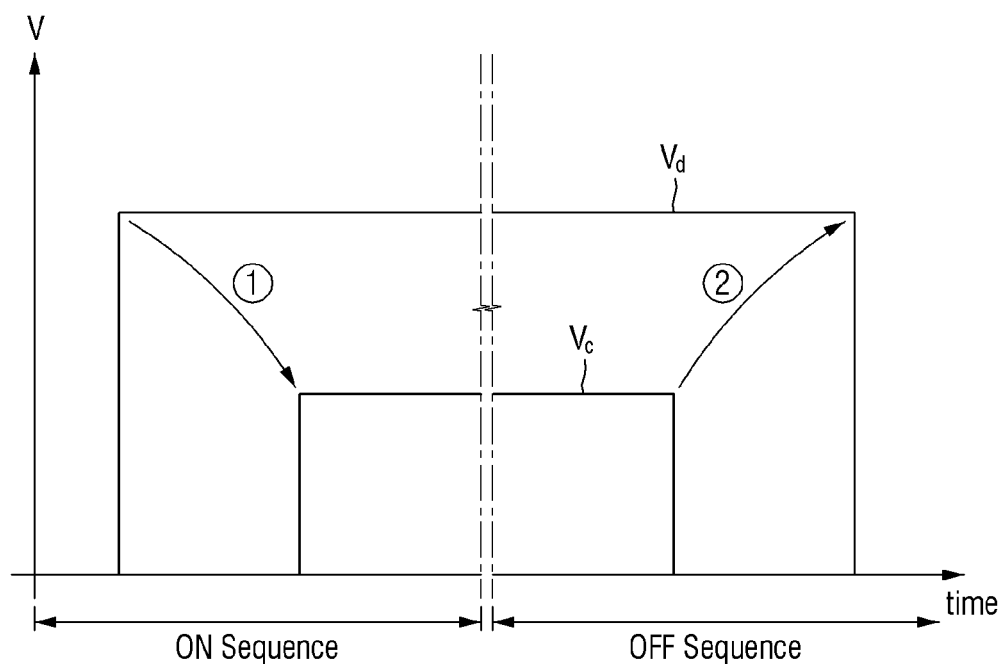
FIG. 11 illustrates a graph of voltage according to time explanatory of the selection of the magnitude of the reference voltage of the semiconductor device according to some embodiments of the inventive concepts.

FIG. 11 illustrates a graph of voltage according to time explanatory of the selection of the magnitude of the reference voltages of the semiconductor device according to some embodiments of the inventive concepts.

Referring to FIG. 11, the power-on operation (On sequence) and the power-off operation (Off sequence) of the semiconductor device are exemplarily illustrated. That is, the power-on operation (On sequence) is performed first for a voltage domain of a higher power supply voltage, and thereafter a power-on operation is performed on a voltage domain of a lower power supply voltage (①).

The power-off operation (Off sequence) is performed first for power of a lower power supply voltage, and thereafter a power-off operation may be performed for a voltage domain of a higher power supply voltage (②).

The power on/off operation as performed as described with respect to FIG. 11 is contrary to the power on/off operation described with respect to FIG. 10. The power on/off operation as described with respect to FIG. 11 may be performed in a case of a semiconductor device in which the data storage is important.

In FIG. 11, the voltage level in which power is turned on first and power is turned off later may correspond to a data storage voltage (Vd) of the semiconductor device for example, and the power level in which power is turned on later and power is turned off first may correspond to a control signal voltage (Vc) for example.

For example, when the semiconductor device is a device such as low power double data rate synchronous dynamic random access memory (LP DDR SDRAM), the semiconductor device needs to maintain the data storage voltage (Vd) as long as possible to prevent damage to data. Thus, the voltage domain using the data storage voltage (Vd) of the higher level may be powered-off later than the voltage domain using the control signal voltage (Vc) of the lower level.

As a result, the reference voltages (V1 to V3) may also be set accordingly. The reference voltages (V1 to V3) may be set in the off-region in which the elements of the voltage domains (PD1 to PDn) are not operated. To this end, the reference voltages (V1 to V3) may be set in proportion to the magnitudes of the levels of the power supply voltages (VDD1 to VDD(n)).

As a result, the first reference voltage (V1) of the first group (G_1) in which the power-off operation is performed first may be smaller than the second reference voltage (V2) of the second group (G_2) performed later. Similarly, the second reference voltage (V2) may be smaller than the third reference voltage (V3). That is, the voltage level generator 120 may generate a voltage level of gradually higher level for each of the comparators 130-1, 130-2, and 130-3.

The semiconductor device according to the present embodiment may clearly reduce the time taken for the power-off operation, while maintaining the data storage voltage (Vd) for a longer time, thereby greatly improving the response speed and responsiveness of the semiconductor device.

Hereinafter, a semiconductor device according to some embodiments of the inventive concepts will be described referring to FIGS. 12 and 13. Description of configuration and functionality of parts of the semiconductor device of this embodiment similar to that of the semiconductor devices described with respect to FIGS. 1-11 may be omitted or simplified in the following.

Figure 12:
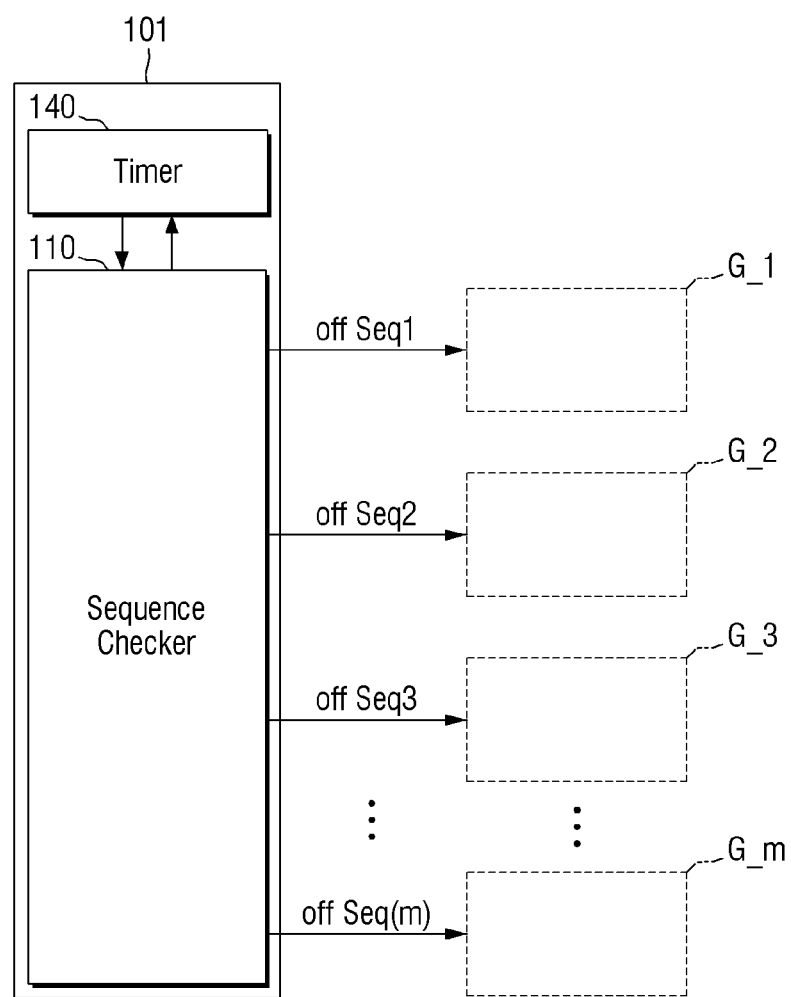
FIG. 12 illustrates a block diagram explanatory of a power-off operation of the semiconductor device according to some embodiments of the inventive concepts.

FIG. 12 illustrates a block diagram explanatory of a power-off operation of a semiconductor device according to some embodiments of the inventive concepts. FIG. 13 illustrates a time chart explanatory of a power-off operation of the semiconductor device of FIG. 12.

Figure 13:
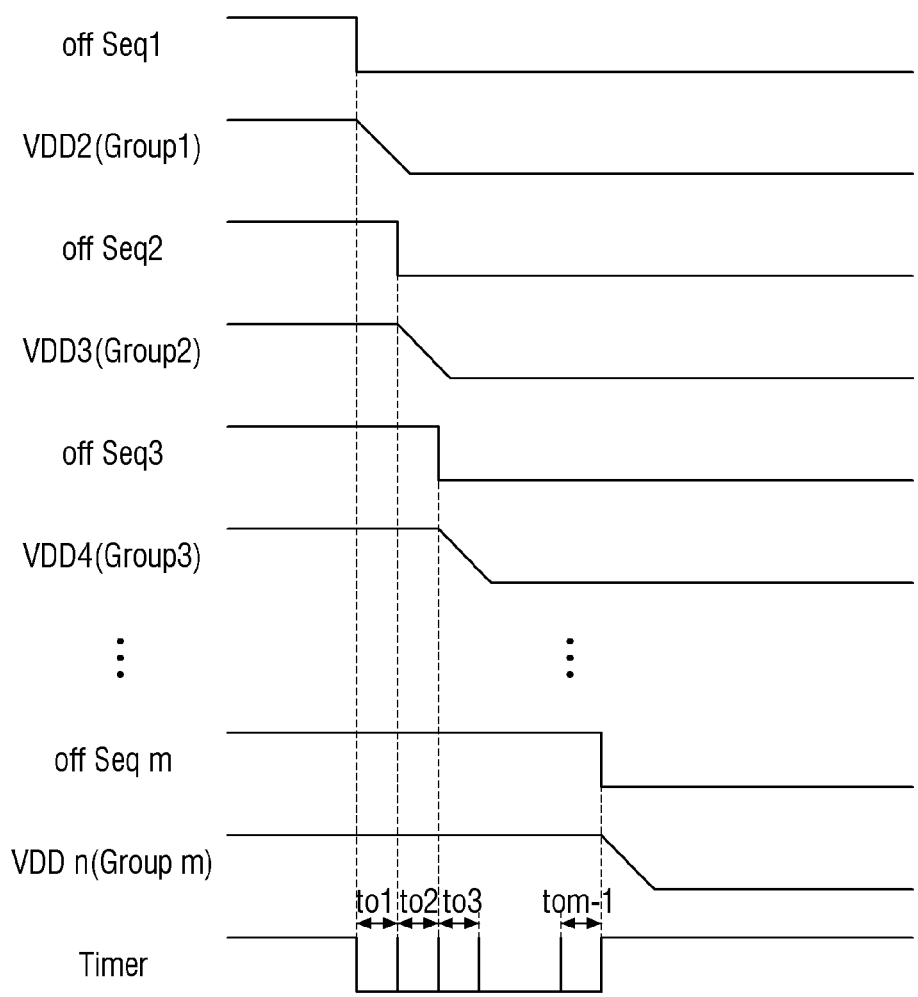
FIG. 13 illustrates a time chart explanatory of a power-off operation of the semiconductor device of FIG. 12.

Referring to FIGS. 12 and 13, a semiconductor device according to some embodiments of the inventive concepts includes a second power sequence controller 101.

The second power sequence controller 101 of the PMIC includes a timer 140 and the sequence checker 110. The timer 140 provides preset reference times to1, to2, to3 . . . and tom-1 (i.e., to1 to tom-1) to the sequence checker 110, and the sequence checker 110 determines the time at which the off-sequence signals (off Seq1 to off Seq(m)) are transmitted, using the reference times (to1 to tom-1).

For example, when the first off-sequence signal (off Seq1) is transmitted by the second power sequence controller 101, the first power source 200-1 and the second power source 200-2 of the first group (G-1) (such as shown in FIG. 5) may start lowering the first power supply voltage (VDD1) and the second power supply voltage (VDD2) to the power-off level. The second off-sequence signal (off Seq2) is then transmitted at a time after the first off-sequence signal (off Seq1) is transmitted and the second power supply voltage (VDD2) which is the representative power supply voltage of the first group (G_1) starts falling. That is, the second off-sequence signal (off Seq2) is transmitted when the first reference time (to1) set by the timer 140 has passed from the time at which the first off-sequence signal (off Seq1) is transmitted.

When the second off-sequence signal (off Seq2) is transmitted by the second power sequence controller 101, the third power source 200-3 of the second group (G_2) may start lowering the third power supply voltage (VDD3) to the power-off level. The third off-sequence signal (off Seq3) is then transmitted at a time after the second off-sequence signal (off Seq2) is transmitted and the third power supply voltage (VVD3) which is the representative power supply voltage of the second group G_2 starts falling. That is, the third off-sequence signal (off Seq3) is transmitted when the second reference time (to2) set by the timer 140 has passed from the time at which the second off-sequence signal (off Seq2) is transmitted.

When the third off-sequence signal (off Seq3) is transmitted by the second power sequence controller 101, the fourth power source 200-4 of the third group (G_3) may start lowering the fourth power supply voltage (VDD4) to the power-off level.

In this way, when the m-th off-sequence signal (off Seq(m)) is transmitted by the second power sequence controller 101, the n–$1^{st}$ power source (200-(n–1)) and the n-th power source (200-n) of the m-th group (G_m) may start lowering the n–$1^{st}$ power supply voltage (VDD (n–1)) and the n-th power supply voltage (VDD(n)) to the power-off level.

All reference times (to1 to tom-1) may have the same value. However, in some embodiments of the inventive concepts, the reference times (to1 to tom-1) may have different values for each group.

For example, the first reference time (to1) of some embodiments may be greater than the second reference time (to2), and the second reference time (to2) may be greater than the third reference time (to3). That is, the reference times (to1 to tom-1) of preceding groups may be greater than the reference times (to1 to tom-1) of next or following groups.

Such a power-off operation as described above with respect to FIGS. 12 and 13 may be for sequentially changing the power-off level and for executing a faster, easier, and reliable power-off operation, whereby the voltage domain with the high level voltage is powered off first as described with respect to FIG. 10, since its power-off time may become relatively longer.

Alternatively, in a semiconductor device according to some embodiments of the inventive concepts, since data storage voltage (Vd) needs to be maintained longer than control signal voltage (Vc) as described with respect to FIG. 11, a reference time of a group to be turned off relatively later may become longer.

In this case, the first reference time (to1) may be smaller than the second reference time (to2), and the second reference time (to2) may be smaller than the third reference time (to3). That is, the reference times (to1 to tom-1) of preceding groups may be smaller than the reference times (to1 to tom-1) of the next or following groups.

In a semiconductor device according to the present embodiment, it is possible to prevent a problem in which the discharge takes much longer than expected due to the capacitors within the power sources and the power-off operation exceptionally takes a very long time, and since power-off is always performed according to a fixed time, a power-off operation with high predictability may be performed. Therefore, the problem may be easily corrected, and the response speed may be improved.

Hereinafter, a semiconductor device according to some embodiments of the inventive concepts will be described referring to FIGS. 14 to 16. Description of configuration and functionality of parts of the semiconductor device of this embodiment similar to that of the semiconductor devices described with respect to FIGS. 1-13 may be omitted or simplified in the following.

Figure 14:
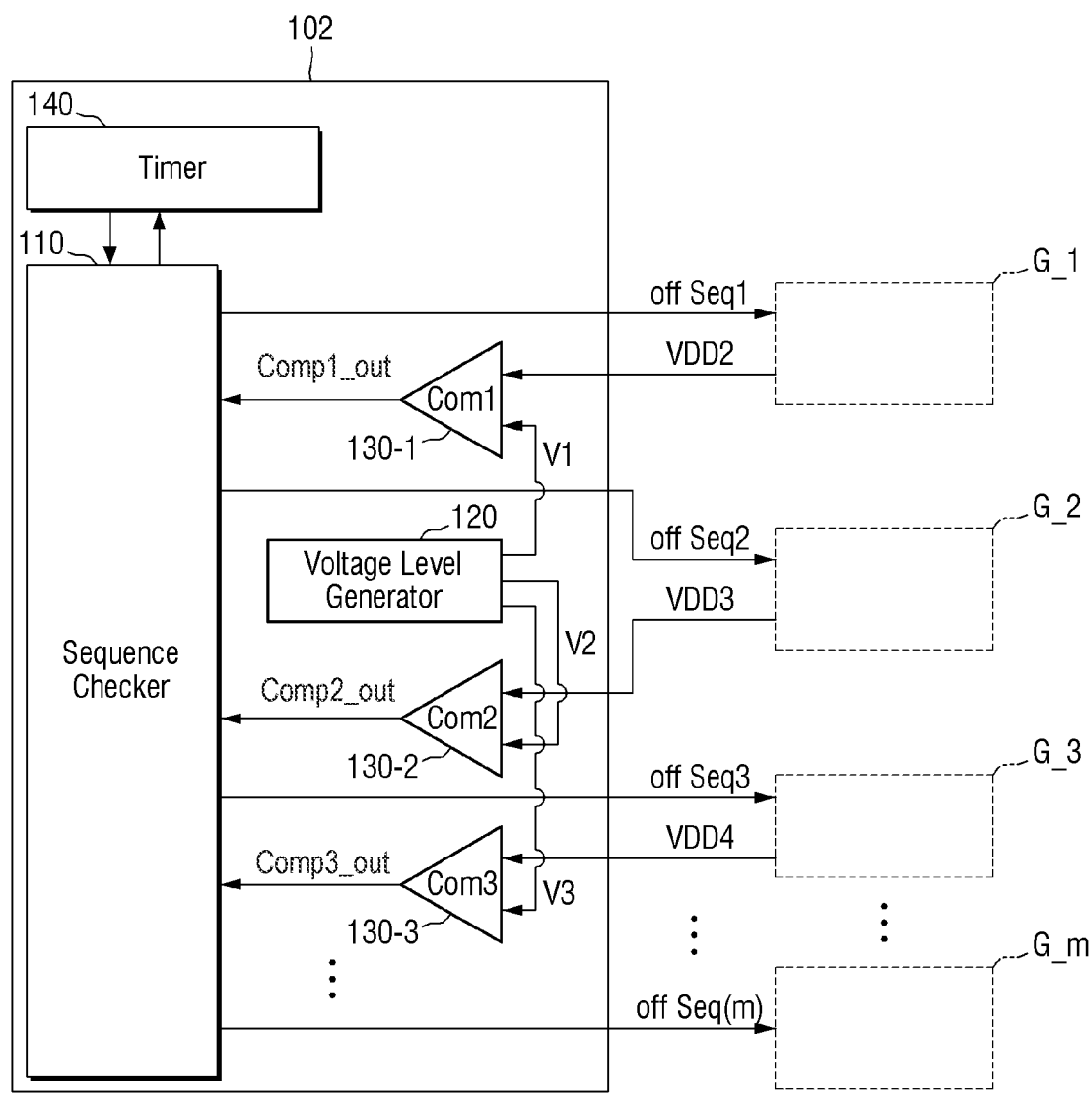
FIG. 14 illustrates a block diagram explanatory of a power-off operation of the semiconductor device according to some embodiments of the inventive concepts.
Figure 15:
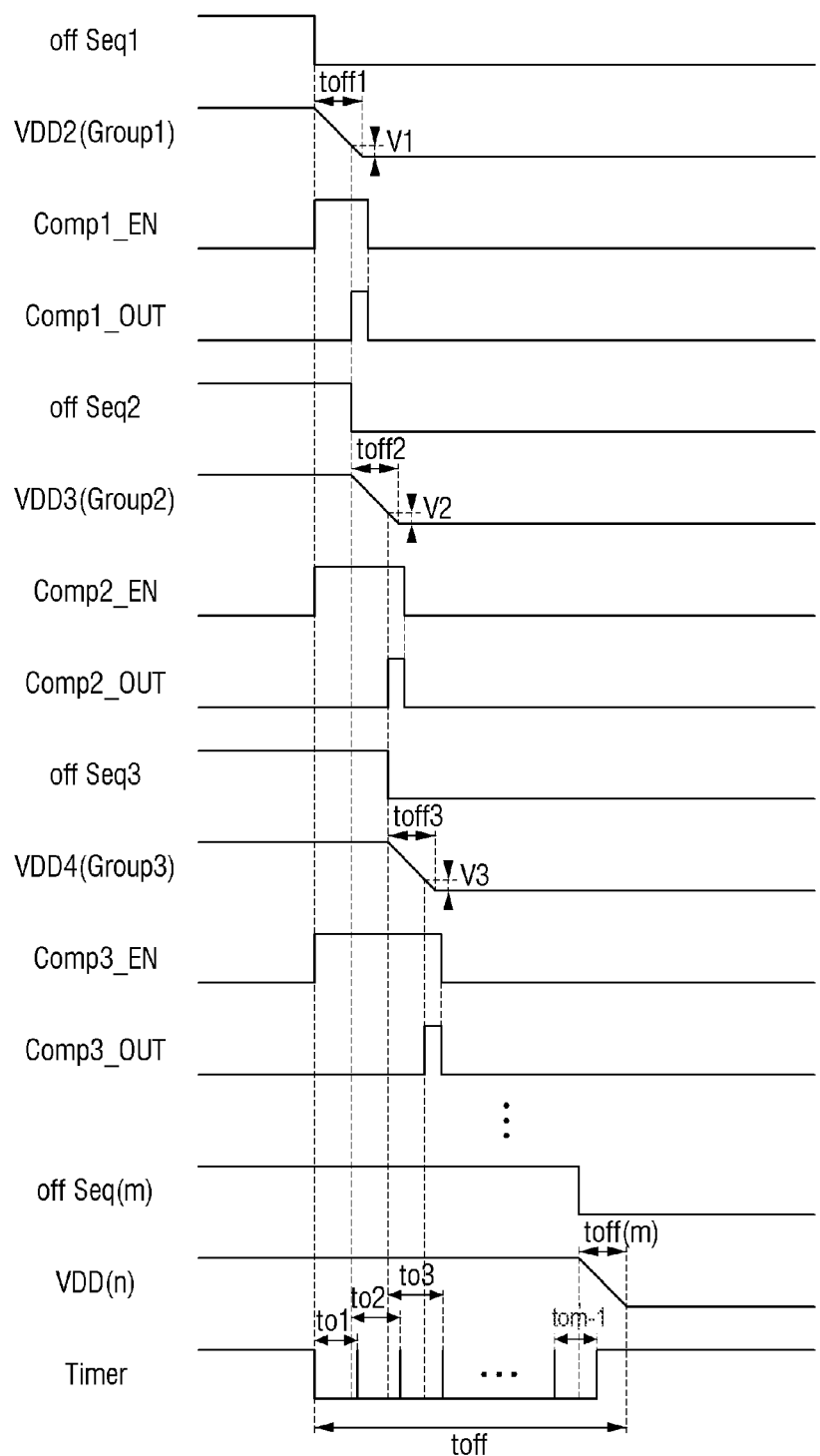
FIG. 15 illustrates a block diagram explanatory of a power-off operation of the power management integrated circuit of FIG. 14 in detail.

FIG. 14 illustrates a block diagram explanatory of a power-off operation of a semiconductor device according to some embodiments of the inventive concepts, and FIG. 15 illustrates a block diagram explanatory of the power-off operation of the power management integrated circuit of FIG. 14 in detail. FIG. 16 illustrates a time chart explanatory of the power-off operation of the semiconductor device of FIG. 14.

Referring to FIG. 14, a semiconductor device according to some embodiments of the inventive concepts includes a third power sequence controller 102.

The third power sequence controller 102 includes comparators 130-1, 130-2, and 130-3 and a voltage level generator 120 as in the first power sequence controller 100 of FIG. 8, and includes a timer 140 as in the second power sequence controller 101 of FIG. 12. Additionally, the third power sequence controller 102 includes the sequence checker 110.

Referring to FIG. 15, when the representative power supply voltage of each group reaches the respective reference voltage (V1 to V3) for each group before the respective reference time (to1 to tom-1) of the timer 140 has passed, the next off-sequence signal from among the off-sequence signals (off Seq1 to off Seq(m)) is transmitted.

That is, the first off-sequence signal (off Seq1) is transmitted, and since the second power supply voltage (VDD2) which is the representative power supply voltage of the first group (G_1) reaches the first reference voltage (V1) before the passage of the first reference time (to1), the second off-sequence signal (Off Seq2) is transmitted responsive to the first output signal (Comp1_OUT) of the first comparator 130-1.

Subsequently, since the second off-sequence signal (off Seq2) is transmitted, and since the third power supply voltage (VDD3) which is the representative power supply voltage of the second group (G_2) reaches the second reference voltage (V2) before the passage of the second reference time (to2), the third off-sequence signal (Off Seq3) is transmitted responsive to the second output signal (Comp2_OUT) of the second comparator 130-2.

Subsequently, since the third off-sequence signal (off Seq3) is transmitted, and since the fourth power supply voltage (VDD4) which is the representative power supply voltage of the third group (G_3) reaches the third reference voltage (V3) before the passage of the third reference time (to3), the next off-sequence signal from among the off-sequence signals (off Seq1 to off Seq(m)) is transmitted responsive to the third output signal (Comp3_OUT) of the third comparator 130-3.

In this way, when the m-th off-sequence signal (off Seq(m)) is transmitted, the n-th power supply voltage (VDD (n)) of the m-th group (G_m) is lowered.

Figure 16:
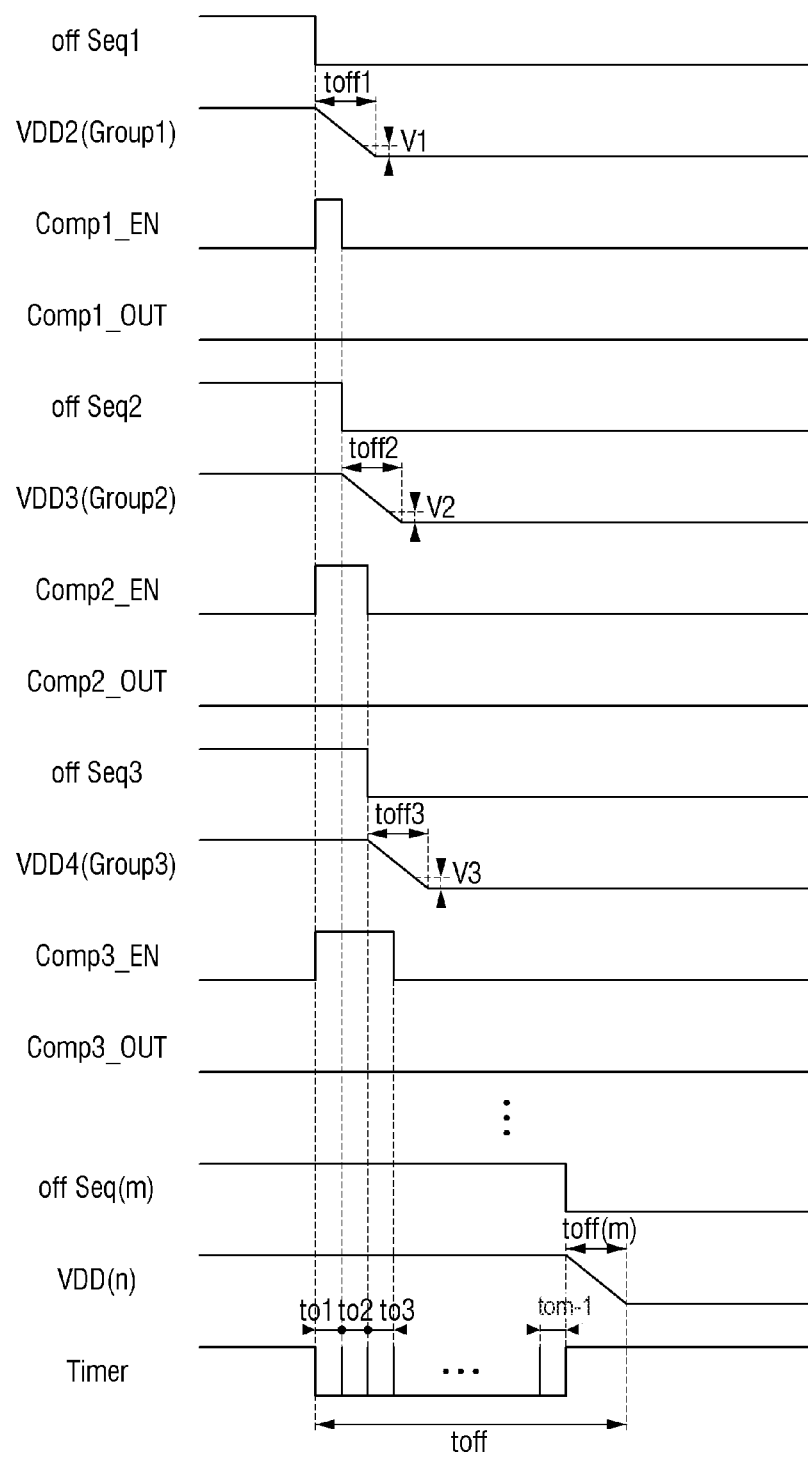
FIG. 16 illustrates a time chart for explaining a power-off operation of the semiconductor device of FIG. 14.

Referring to FIG. 16, when the respective reference time (to1 to tom-1) of the timer 140 has passed before the representative power supply voltage of each group reaches the respective reference voltage (V1 to V3), the next off sequence signal from among the off-sequence signals (off Seq1 to off Seq (m)) is transmitted.

That is, the first off-sequence signal (off Seq 1) is transmitted, and since the first reference time (to1) has passed before the second power supply voltage (VDD2), which is the representative power supply voltage of the first group (G_1), reaches the first reference voltage (V1), the second off sequence signal (off Seq2) is transmitted at the time when the first reference time (to1) has passed. Further, at the time when the first reference time (to1) has passed, the first enable signal (Comp1_EN) of the first comparator (130-1) is changed to "low", and the first output signal (Comp1_OUT) may also be maintained at "low" at the same time.

Subsequently, since the second off-sequence signal (off Seq2) is transmitted, and since the second reference time (to2) has passed before the third power supply voltage (VDD3), which is the representative power supply voltage of the second group (G_2), reaches the second reference voltage (V2), the third off sequence signal (off Seq3) is transmitted at the time when the second reference time (to2) has passed. Also, when the second reference time (to2) has passed, the second enable signal (Comp2_EN) of the second comparator 130-2 is changed to "low", and the second output signal (Comp2_OUT) may also be maintained at "low".

Subsequently, since the third off-sequence signal (off Seq3) is transmitted, and since the third reference time (to3) has passed before the fourth power supply voltage (VDD4), which is the representative power supply voltage of the third group (G_3), reaches the third reference voltage (V3), the next off-sequence signal from among the off-sequence signals (off Seq1 to off Seq(m)) is transmitted at the time when the third reference time (to3) has passed. Also, when the third reference time (to3) has passed, the third enable signal (Comp3_EN) of the third comparator 130-3 is changed to "low", and the third output signal (Comp3_OUT) may also be maintained at "low".

In this way, when the m-th off sequence signal (off Seq(m)) is transmitted, the n-th power supply voltage (VDD (n)) of the m-th group (G_m) may be lowered.

The semiconductor device according to the present embodiment may prevent a problem in which the discharge takes much longer than expected due to charge stored in capacitors within the power sources which consequently results in the power-off operation exceptionally taking a very long time. Furthermore, even in the case where the discharge speed is fast, since the next procedure may be executed without waiting the predetermined time, it is possible to greatly improve the power-off speed of the semiconductor device.

Hereinafter, a power-off method of a semiconductor device according to some embodiments of the inventive concepts will be described with reference to FIGS. 5, 9, and 17 to 19. Description of configuration and functionality of parts of the semiconductor device of this embodiment similar to that of the semiconductor devices described with respect to FIGS. 1-15 may be omitted or simplified in the following.

Figure 17:
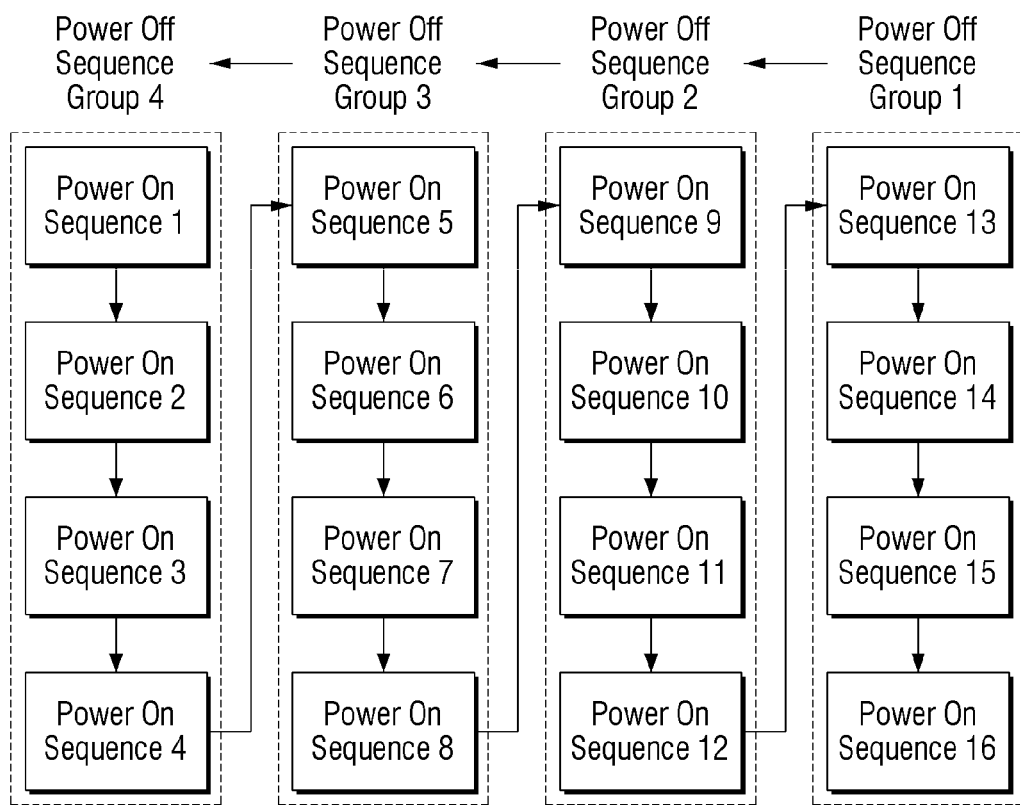
FIG. 17 illustrates a conceptual flowchart explanatory of a power-off method of the semiconductor device according to some embodiments of the inventive concepts.
Figure 18:
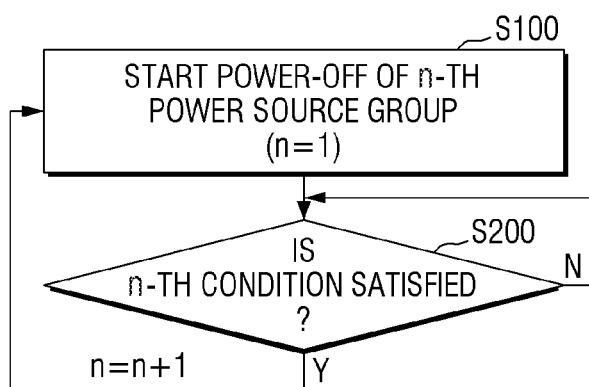
FIG. 18 illustrates a flowchart explanatory of a power-off method of the semiconductor device according to some embodiments of the inventive concepts.
Figure 19:
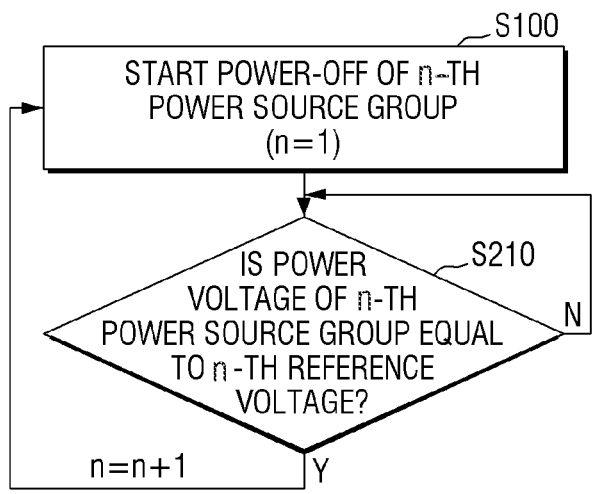
FIG. 19 illustrates a flowchart explanatory of a power-off method of the semiconductor device of FIG. 18 in detail.

FIG. 17 illustrates a conceptual flowchart explanatory of a power-off method of a semiconductor device according to some embodiments of the inventive concept. FIG. 18 illustrates a flowchart explanatory of a power-off method of the semiconductor device according to some embodiments of the inventive concepts. FIG. 19 illustrates a flowchart explanatory of the power-off method of the semiconductor device in FIG. 18 in detail.

Referring to FIG. 17, a power-on method of a semiconductor device according to some embodiments of the inventive concepts includes sequentially executing the sequential power-on sequences (Power On Sequences 1 to 16). That is, the Power On Sequence 1 may be executed first, followed by execution of the Power On Sequence 2, followed by execution of the Power On Sequence 3 and so forth, until all power-on sequences are executed concluding with the Power On Sequence 16. Conversely, the power-off method of the semiconductor device according to some embodiments of the inventive concepts includes executing power-off sequences (Power Off Sequence Groups 1-4) as shown in a reverse order in which the above-described power-on sequences (Power On Sequences 1-16) are executed.

The power-on sequences (Power On Sequences 1 to 16) are executed sequentially one by one because the execution time of each sequence is not long. However, in the case of executing the power-off method, by grouping the power-off operations into power-off sequence groups (Power Off Sequence Groups 1 to 4) according to capacitor discharge or the like, a plurality of power-off operations of respective voltage domains that were powered-on during power-on sequences (Power On Sequences 1 to 16) may be simultaneously executed in the power-off sequence.

In FIG. 17, four power-on sequences are included in each group. For example, Power Off Sequence Group 1 includes a plurality of power-off operations of respective voltage domains that were powered-on during Power On Sequence 13, Power On Sequence 14, Power On Sequence 15 and Power On Sequence 16. However, in some embodiments of the inventive concepts, the number of power-on sequences in a group may be different than four.

Referring to FIGS. 5, 9, and 18, in a power-off method of a semiconductor device according to some embodiments of the inventive concepts, power-off of the first power source group is started first (S100), where initially n=1.

Here, the power source groups may mean the first to m-th groups (G_1 to G_m) of FIG. 5, and the first power source group may mean the first group (G_1).

Subsequently, it is determined whether the first condition is satisfied (S200), where initially n=1.

If the first condition is satisfied (Y in S200), n is incremented as n=n+1, and power-off of the second power source group (n=2), that is, the second group (G_2) may be started (S100). If the first condition is not satisfied (N in S200), process flow returns to S200 and the power-off of the second group (G_2) does not start until the first condition is satisfied in S200.

In this way, when the n-th condition is satisfied, the power-off of the (n+1)-th group may be started. Here, n is a natural number.

For example, referring to FIGS. 9 and 19, it is determined in S210 whether or not the power voltage of the first power source group is equal to the first reference voltage.

That is, the first condition in S200 of FIG. 18 in some embodiments may be as in S210 shown in FIG. 19 including for example determining when n=1 whether the second power supply voltage (VDD2) which is the representative power supply voltage of the first power source group, that is, the first group (G_1), is equal to the first reference voltage (V1). Therefore, when the second power supply voltage (VDD2) becomes equal to the first reference voltage (V1) (Y in S210), the power-off of the second group (G2) (n=n+1) may be executed as process flow returns to S100. Furthermore, when the third power supply voltage (VDD3) becomes equal to the second reference voltage (V2), the power-off of the third group (G3) may be executed.

Hereinafter, the power-off method of the semiconductor device according to some embodiments of the inventive concepts will be described with reference to FIGS. 13, 18 and 20. Description of aspects of this embodiment similar to those previously described may be omitted or simplified in the following.

Figure 20:
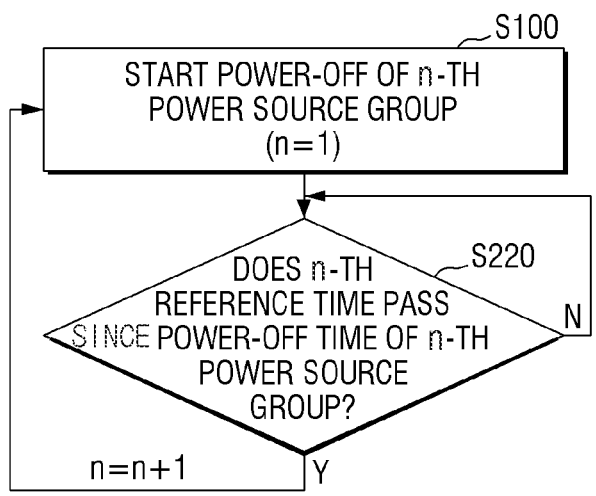
FIG. 20 illustrates a flowchart explanatory of a power-off method of the semiconductor device according to some embodiments of the inventive concepts.

FIG. 20 illustrates a flowchart explanatory of a power-off method of a semiconductor device according to some embodiments of the inventive concepts.

Referring to FIGS. 18 and 20, the first condition S200 of FIG. 18 in some embodiments may be as in S220 shown in FIG. 20 including for example determining when N=1 whether the first reference time has passed since (i.e., from) the time of power-off of the first power source group.

For example, referring to FIG. 13, when the reference times (to1 to tom-1) determined by the timer 140 have been passed, the power-off of the next group may be started.

For example, when the first reference time (to1) has passed since the start time of power-off of the first group (G_1) (Y in S220), the power-off of the second group (G_2) (n=n+1) is started as process flow returns to S100, and thereafter when the second reference time (to2) has passed since the start time of the power-off of the second group (G_2), the power-off of the third group (G_3) may be started.

In this way, when the n-th condition is satisfied, the power-off of the (n+1)-th group may be started. Here, n is a natural number.

Hereinafter, a power-off method of a semiconductor device according to some embodiments of the inventive concepts will be described with reference to FIGS. 15, 16, 18 and 21. Description of aspects of this embodiment similar to that previously described may be omitted or simplified in the following.

Figure 21:
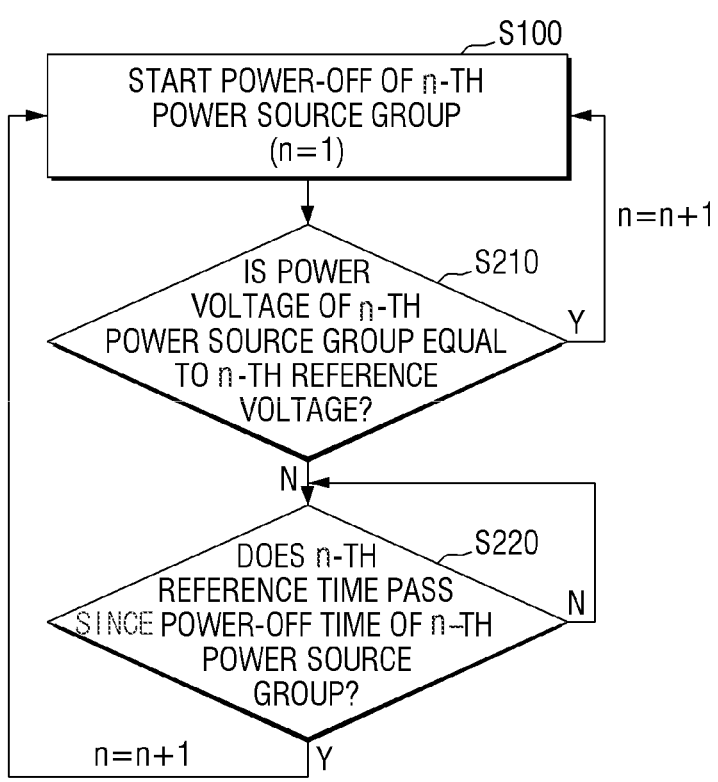
FIG. 21 illustrates a flowchart explanatory of a power-off method of the semiconductor device according to some embodiments of the inventive concepts.

FIG. 21 illustrates a flowchart explanatory of a power-off method of a semiconductor device according to some embodiments of the inventive concepts.

Referring to FIG. 21, the first condition S200 of FIG. 18 in some embodiments may be as in S210 shown in FIG. 21 including for example determining when n=1 whether the power voltage of the first power source group is equal to the first reference voltage, and may be as in S220 including for example when n=1 determining whether the first reference time has passed since (i.e., from) the power-off time of the first power source group.

For example, referring to FIGS. 15 and 16, when the second power supply voltage (VDD2) which is the representative power supply voltage of the first group (G_1) reaches the first reference voltage (V1) before first reference time (to1) has passed since the power-off starting time of the first group (G_1) (Y in S210), or when the first reference time (to1) has passed since the power-off starting time of the first group (G_1) before the second power supply voltage (VDD2) reaches the first reference voltage (V1) (Y in S220), the power-off of the second group may be started as process flow returns to S100 in either case.

Subsequently, when the third power supply voltage (VDD3) which is the representative power supply voltage of the second group (G_2) reaches the second reference voltage (V2) before second reference time (to2) has passed since the power-off starting time of the second group (G_2) (Y in S210), or when the second reference time (to2) has passed since the power-off starting time of the second group (G_2) before the third power supply voltage (VDD3) reaches the second reference voltage (V2) (Y in S220), the power-off of the third group may be started as process flow again returns to S100 in either case.

In this way, when the n-th condition is satisfied, the power-off of the (n+1)-th group may be started. Here, n is a natural number.

While the present inventive concepts have been particularly shown and described with reference to exemplary embodiments thereof, it will be understood by those of ordinary skill in the art that various changes in form and details may be made therein without departing from the spirit and scope of the inventive concepts as defined by the following claims. It is therefore desired that the present embodiments be considered in all respects as illustrative and not restrictive, reference being made to the appended claims rather than the foregoing description to indicate the scope of the inventive concepts.

What is claimed is:

1. A power management integrated circuit comprising:
a first power source group including a plurality of first power sources, wherein the first power source group is configured to provide a first representative power supply voltage;
a second power source group including a plurality of second power sources, wherein the second power source group is configured to provide a second representative power supply voltage; and
a power sequence controller,
wherein the power sequence controller is configured to power off the first power source group and the second power source group, one group at a time, by:
controlling at least one of the plurality of first power sources to start to drop power supply level, to cause the first representative power supply voltage to decrease,
receiving the first representative power supply voltage, and
in response to the first representative power supply voltage decreasing to a first reference voltage, controlling at least one of the plurality of second power sources to start to drop power supply level.

2. The power management integrated circuit of claim 1, further comprising a third power source group including a plurality of third power sources,
wherein the power sequence controller is configured to start a power off operation of the third power source group in response to the second representative power supply voltage decreasing to a second reference voltage, and
wherein the second reference voltage is different from the first reference voltage.

3. The power management integrated circuit of claim 2, wherein the plurality of the second power sources in the second power source group are powered off sequentially one by one.

4. The power management integrated circuit of claim 1, further comprising a third power source group including a plurality of third power sources,
wherein the power sequence controller is configured to start a power-off operation of the third power source group based on a first reference time passing before the second representative power supply voltage becomes a second reference voltage.

5. The power management integrated circuit of claim 1, wherein the power sequence controller is configured to start a power-off operation of the second power source group before a first reference time has passed.

6. The power management integrated circuit of claim 1, wherein the first representative power supply voltage is an arbitrarily selected power supply voltage among power supply voltages generated by a first power source of the plurality of first power sources and a second power source of the plurality of first power sources.

7. The power management integrated circuit of claim 6, wherein the plurality of the first power sources have similar levels of power supply voltage.

8. The power management integrated circuit of claim 1, wherein the first representative power supply voltage is a power supply voltage of a power source having a longest power-off time from among the plurality of first power sources in the first power source group.

9. The power management integrated circuit of claim 1, wherein the first representative power supply voltage is predetermined based on a priority of a power source, from among the plurality of first power sources in the first power source group, that provides the first representative power supply voltage.

10. A power management integrated circuit comprising:
a plurality of power source groups, each including a plurality of power sources; and
a power sequence controller configured to start to power off operations of the plurality of the power source groups, one group at a time in a sequence, by:
receiving a representative power supply voltage of a prior power source group in the sequence,
comparing the representative power supply voltage of the prior power source group with a reference voltage corresponding to the prior power source group, and
starting a power off operation of a current power source group in the sequence in response to the representative power supply voltage of the prior power source group decreasing to the reference voltage corresponding to the prior power source group.

11. The power management integrated circuit of claim 10, further comprising a voltage level generator, wherein the voltage level generator is configured to generate pre-set reference voltages to provide reference voltages corresponding to the plurality of power source groups.

12. The power management integrated circuit of claim 11, wherein the pre-set reference voltages are different values for each of the plurality of power source groups.

13. The power management integrated circuit of claim 11, wherein all the pre-set reference voltages have a same value.

14. The power management integrated circuit of claim 10, wherein the representative power supply voltage of the prior power source group is an arbitrarily selected power supply voltage from among a plurality of power supply voltage of a plurality of power sources in the prior power source group.

15. The power management integrated circuit of claim 10, wherein the representative power supply voltage of the prior power source group is a power supply voltage of a power source having a longest power-off time among a plurality of the power sources in the prior power source group.

16. The power management integrated circuit of claim 10, wherein the representative power supply voltage of the prior power source group is predetermined based on a priority of a power source in the prior power source group that provides the representative power supply voltage.

17. The power management integrated circuit of claim 10, wherein the power sequence controller is configured to, before a first representative power supply voltage of a first power source group of the plurality of power source groups becomes a first reference voltage, starting a power-off operation of a second power source group of the plurality of power source groups in response to a first reference time passing since time at which a power-off operation of the first power source group was started.

18. A power management integrated circuit comprising:
   a first power source group including a first power source and a second power source;
   a second power source group including a third power source which and a fourth power source;
   a power sequence controller; and
   a timer configured to configured to provide a first reference time and a second reference time,
   wherein the power sequence controller is configured to:
   receive a representative power supply voltage output by the first power source, and
   cause the second power source group to start to power off in response to the representative power supply voltage decreasing to a first reference voltage, before the first reference time has passed since a start of a power-off operation of the first power source group.

19. The power management integrated circuit of claim 18, further comprising a voltage level generator configured to generate the first reference voltage and a second reference voltage corresponding to the second power source group.

* * * * *